United States Patent
Kato et al.

(10) Patent No.: US 9,831,278 B2
(45) Date of Patent: Nov. 28, 2017

(54) SOLID-STATE IMAGE SENSOR AND CAMERA WITH PIXEL OPENINGS

(71) Applicant: CANON KABUSHIKI KAISHA, Tokyo (JP)

(72) Inventors: Taro Kato, Kawasaki (JP); Jun Iba, Yokohama (JP); Koichiro Iwata, Kawasaki (JP); Hiroo Akabori, Fujisawa (JP); Shota Shigemori, Kawasaki (JP); Kouhei Hashimoto, Oita (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/996,774

(22) Filed: Jan. 15, 2016

(65) Prior Publication Data

US 2016/0218127 A1   Jul. 28, 2016

(30) Foreign Application Priority Data

Jan. 26, 2015  (JP) .................................. 2015-012532

(51) Int. Cl.
*H04N 5/378* (2011.01)
*H01L 27/146* (2006.01)

(52) U.S. Cl.
CPC .. *H01L 27/14609* (2013.01); *H01L 27/14603* (2013.01); *H01L 27/14621* (2013.01);
(Continued)

(58) Field of Classification Search
CPC ......... H01L 27/14603; H01L 27/14609; H01L 27/14621; H01L 27/14623; H01L 27/14627; H04N 5/378
See application file for complete search history.

(56) References Cited

U.S. PATENT DOCUMENTS 7,993,951 B2   8/2011   Okabe et al.
8,013,369 B2   9/2011   Iwata et al.
(Continued)

FOREIGN PATENT DOCUMENTS

JP   2013-157883 A   8/2013
WO   2010-061756 A1   6/2010

OTHER PUBLICATIONS

European Search Report issued in counterpart European Application No. 16150024.4, dated Jun. 1, 2016.

*Primary Examiner* — Amy Hsu
(74) *Attorney, Agent, or Firm* — Fitzpatrick, Cella, Harper & Scinto

(57) ABSTRACT

A solid-state image sensor includes a plurality of pixels for focus detection, each of the pixels including a photoelectric converter arranged in a semiconductor substrate, a microlens, and a light blocking portion arranged between the semiconductor substrate and the microlens to cover part of the photoelectric converter. A face in the pixel, which is parallel to a surface of the semiconductor substrate and on which the light blocking portion is arranged, includes a first opening and a second opening in addition to the light blocking portion. The light blocking portion includes a separator that has a light blocking property and is arranged between the first opening and the second opening. The second opening is larger in area than the first opening, and the light blocking portion is larger in area than the first opening.

16 Claims, 20 Drawing Sheets

(52) U.S. Cl.
CPC .. *H01L 27/14623* (2013.01); *H01L 27/14627* (2013.01); *H01L 27/14643* (2013.01); *H04N 5/378* (2013.01)

(56) References Cited

U.S. PATENT DOCUMENTS

| | | |
|---|---|---|
| 8,293,559 B2 | 10/2012 | Okabe et al. |
| 8,415,724 B2 | 4/2013 | Iwata et al. |
| 8,964,084 B2 | 2/2015 | Yamashita |
| 9,001,262 B2* | 4/2015 | Onuki ................ H04N 5/23212 348/222.1 |
| 9,093,345 B2 | 7/2015 | Kato et al. |
| 9,148,591 B2 | 9/2015 | Moriya et al. |
| 2011/0317042 A1* | 12/2011 | Goto ..................... G02B 7/346 348/241 |
| 2012/0300106 A1* | 11/2012 | Kobayashi ........ H01L 27/14603 348/308 |
| 2013/0182156 A1 | 7/2013 | Moriya et al. |
| 2013/0194471 A1 | 8/2013 | Yamashita |
| 2014/0035086 A1 | 2/2014 | Kato |
| 2014/0104474 A1* | 4/2014 | Tange ............... H01L 27/14627 348/308 |
| 2014/0111681 A1* | 4/2014 | Fukuda .................. G02B 7/34 348/340 |
| 2014/0145287 A1 | 5/2014 | Kato |
| 2014/0176780 A1* | 6/2014 | Koshiba .................. G02B 7/34 348/336 |
| 2015/0109499 A1 | 4/2015 | Yamashita |

\* cited by examiner

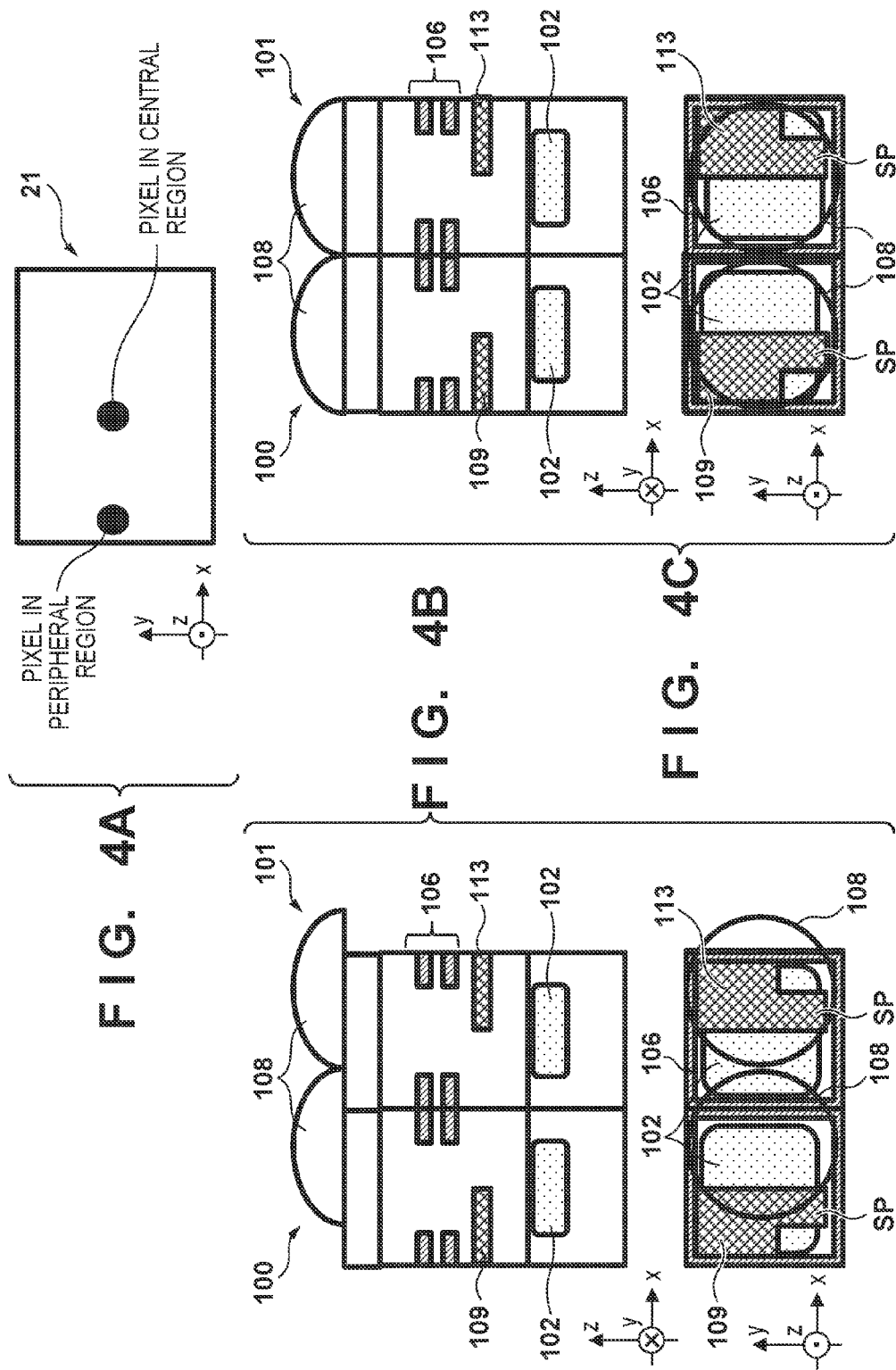

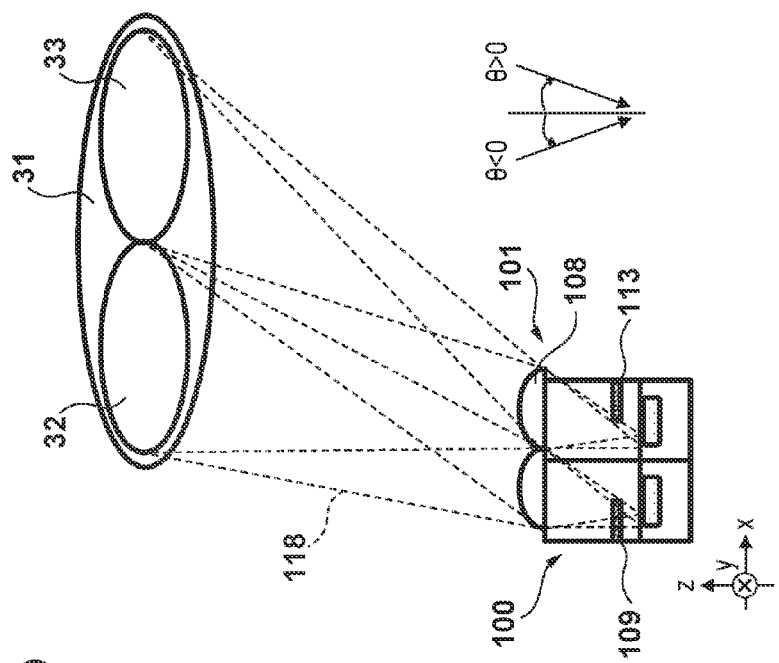
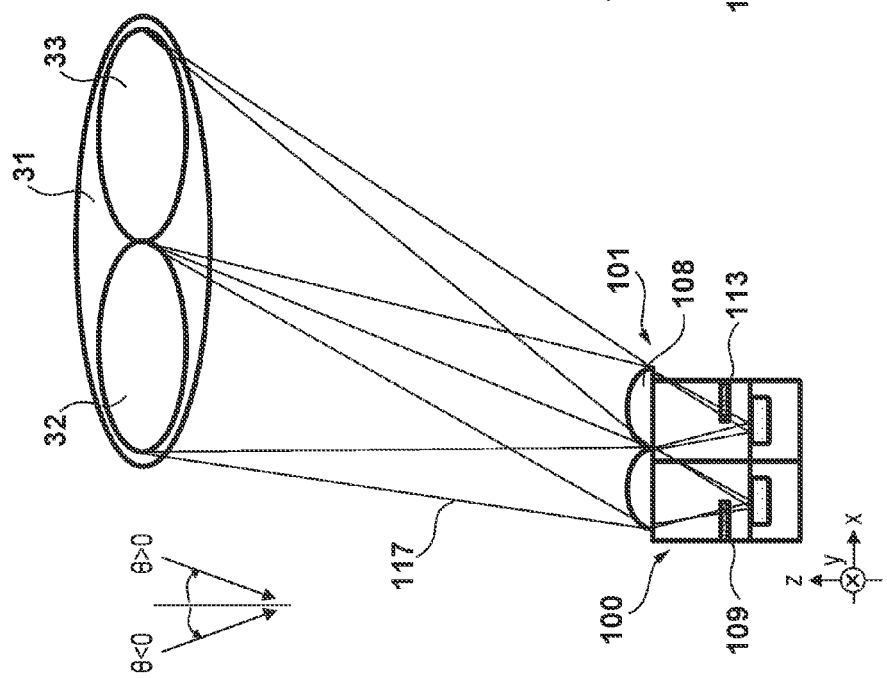

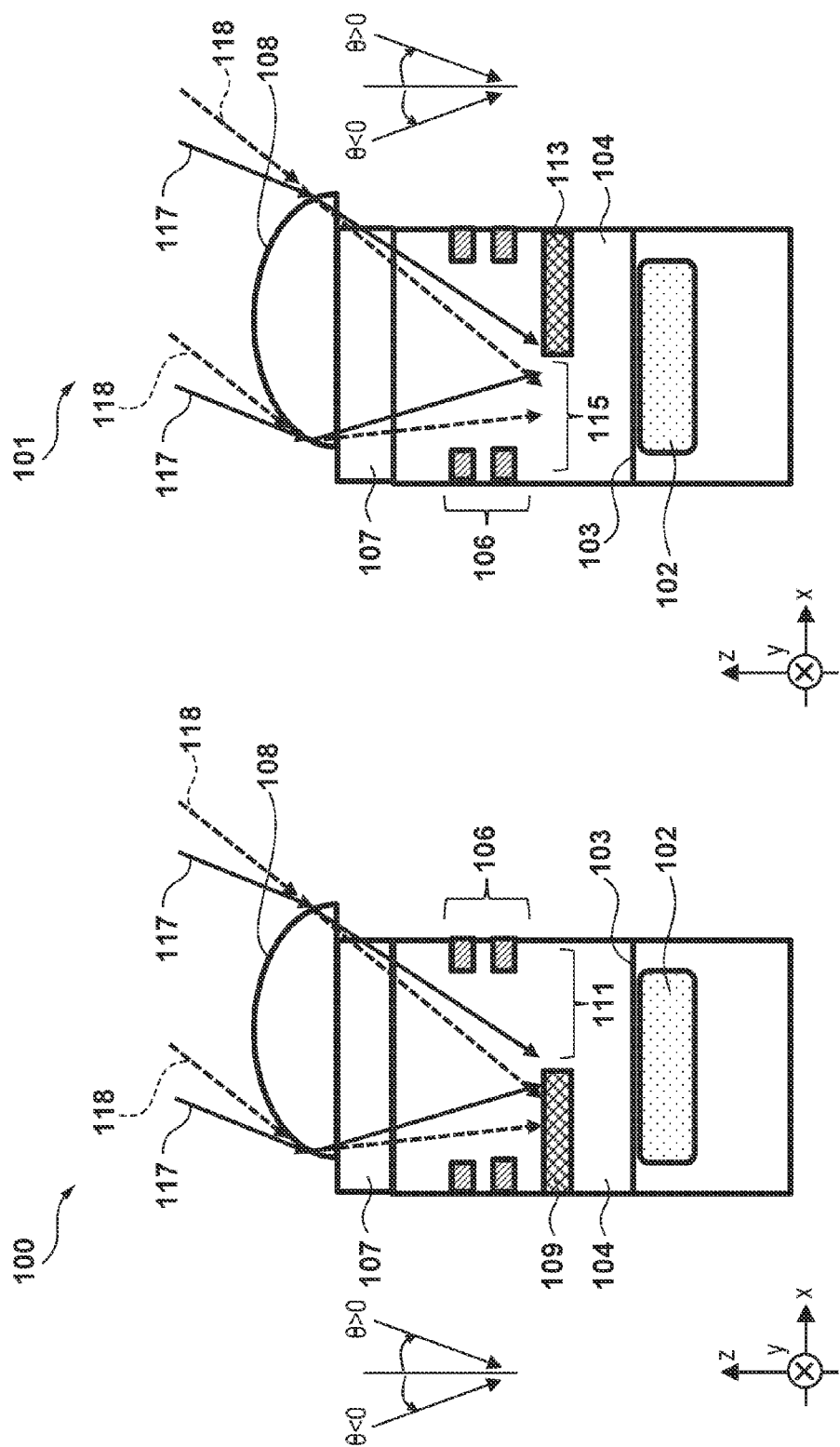

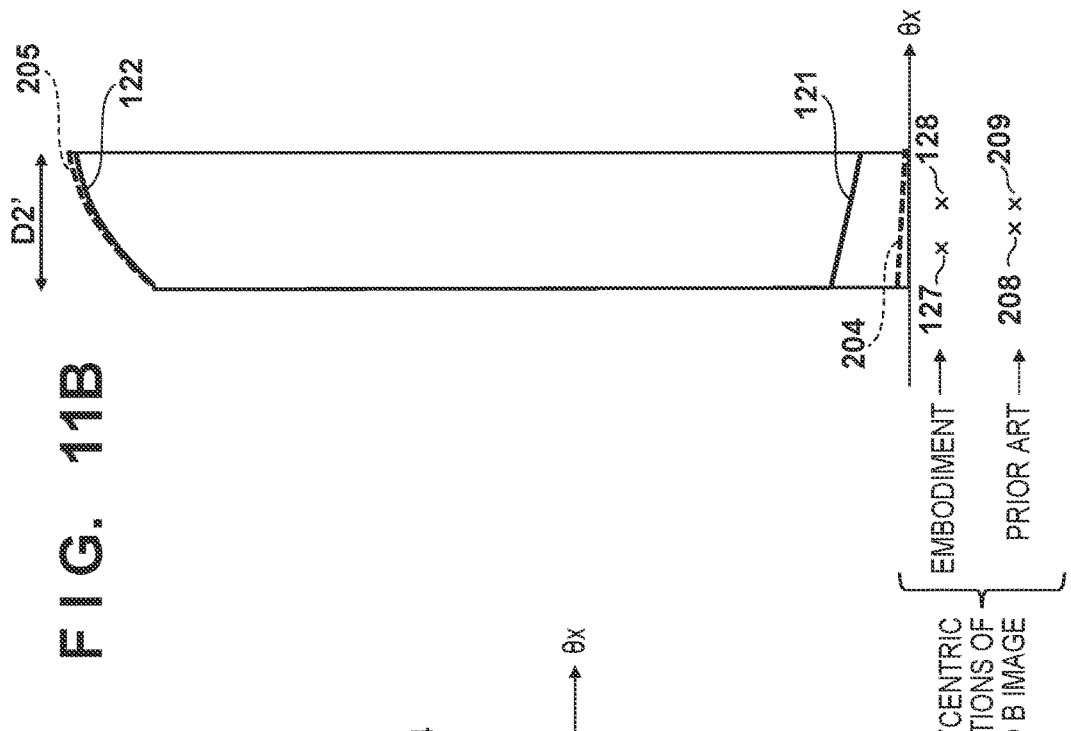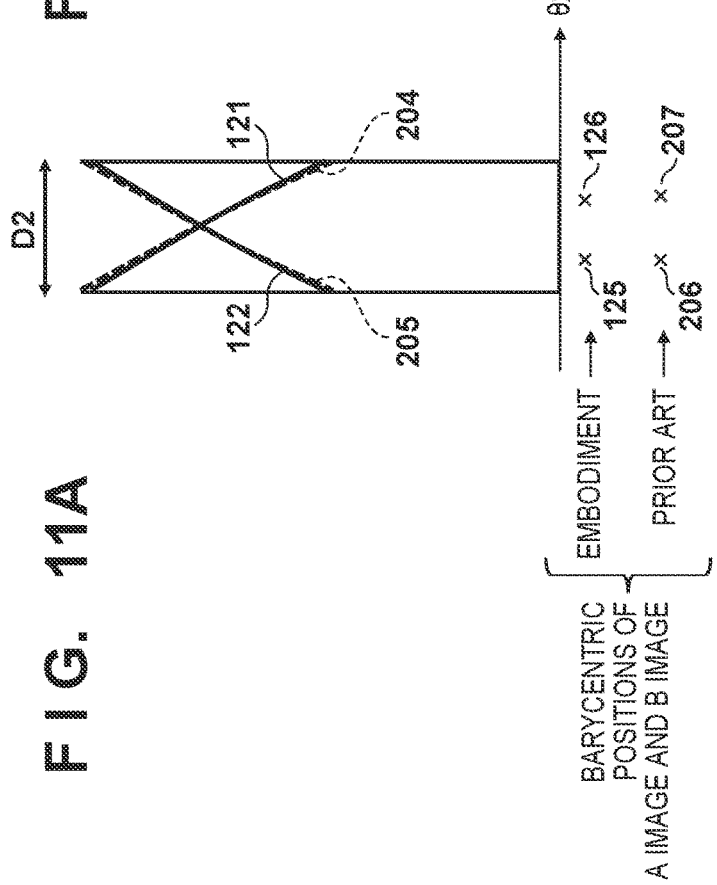

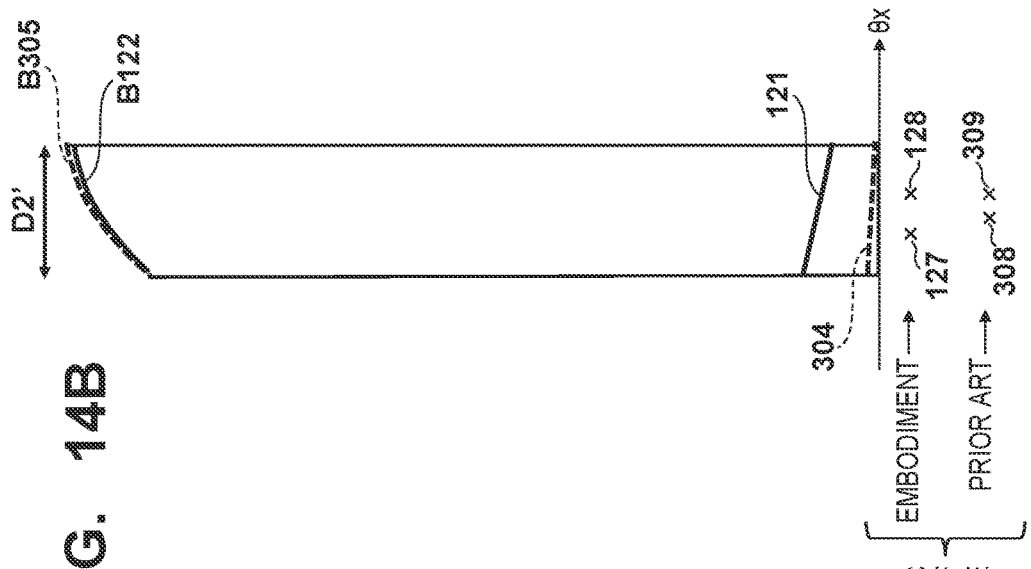
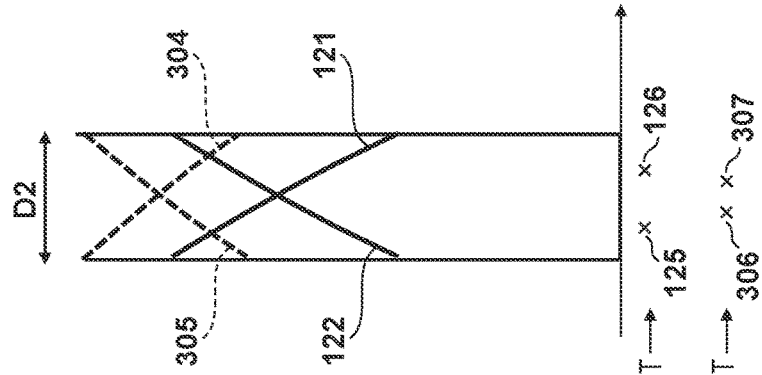

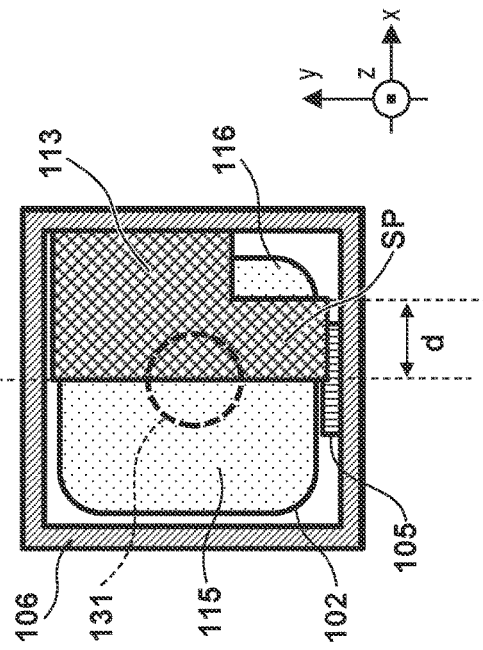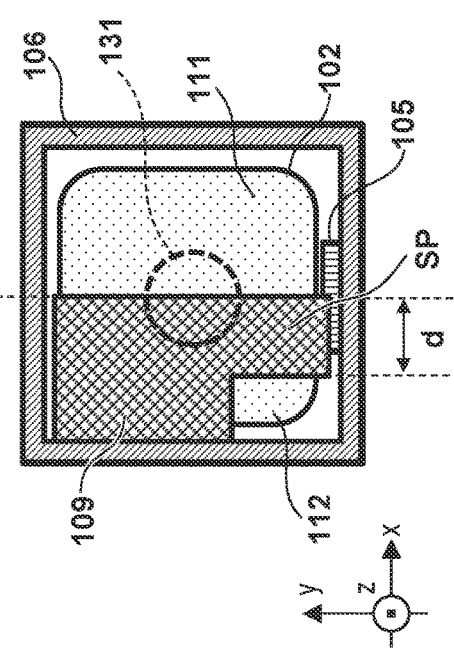

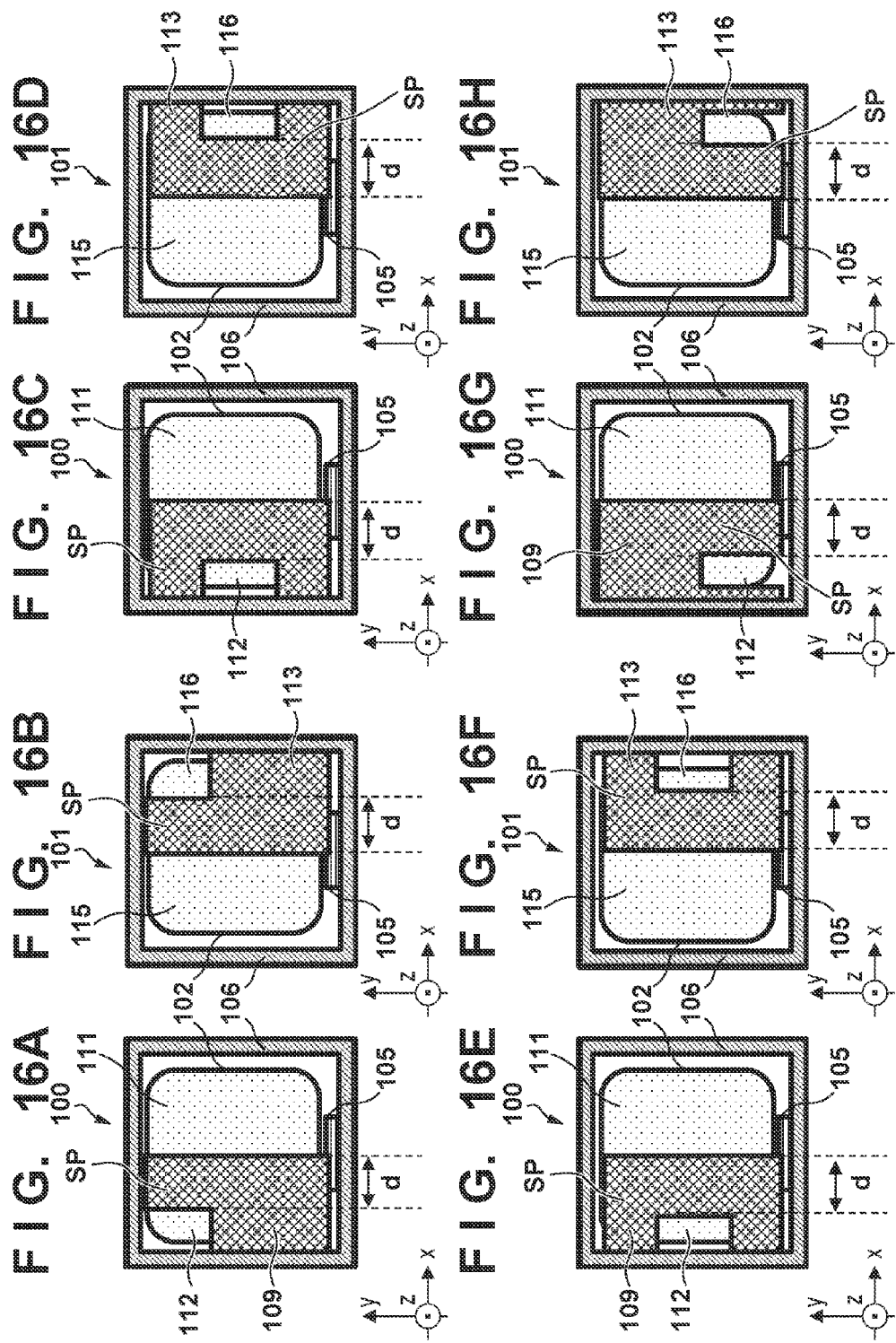

FIG. 17A
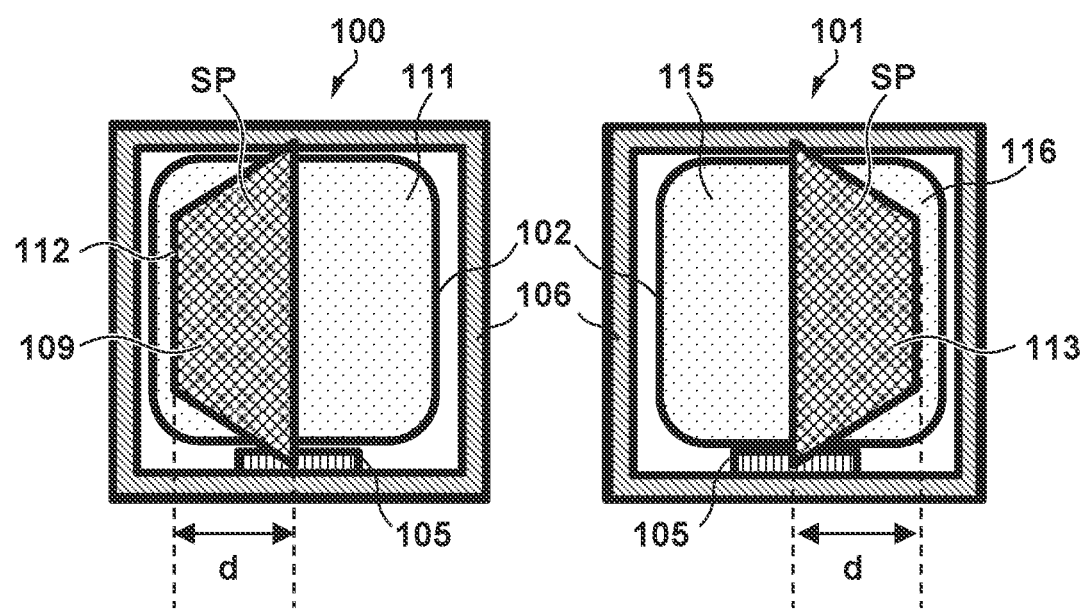
FIG. 17B
FIG. 18
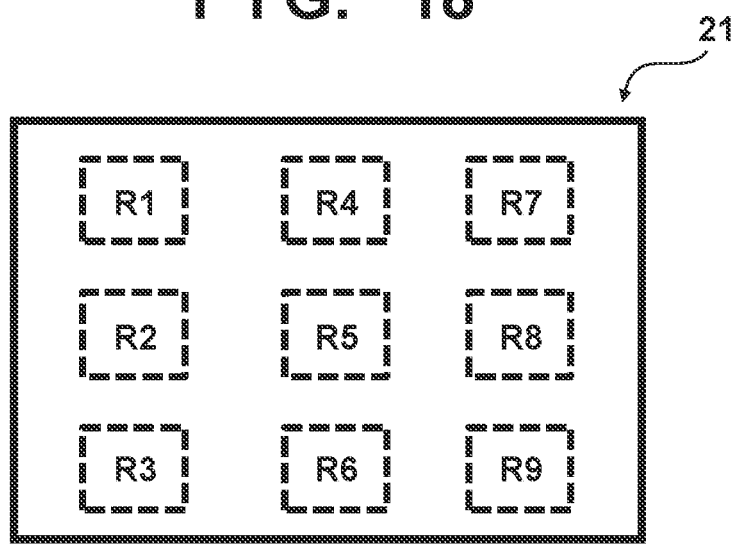

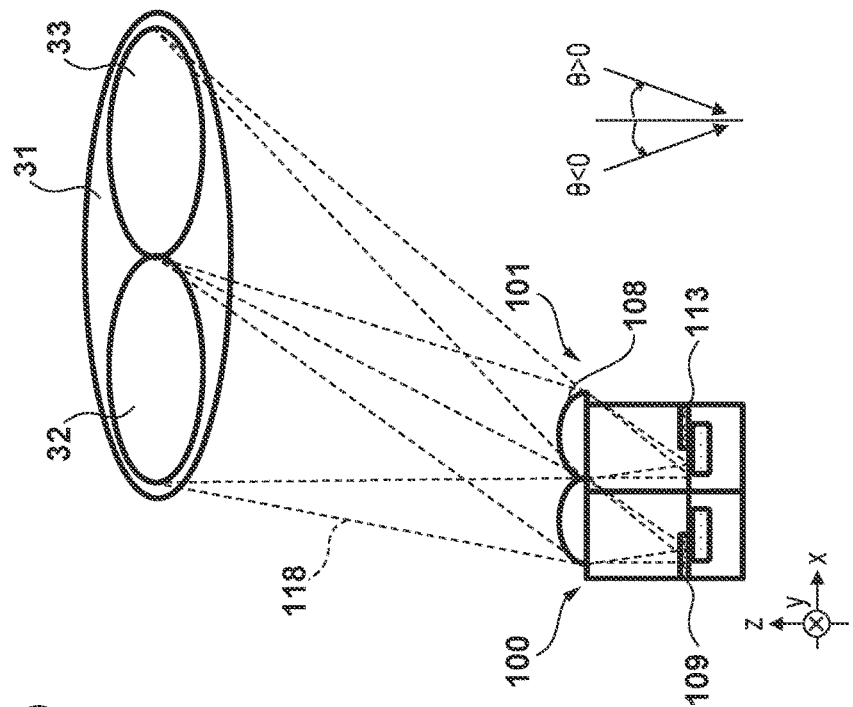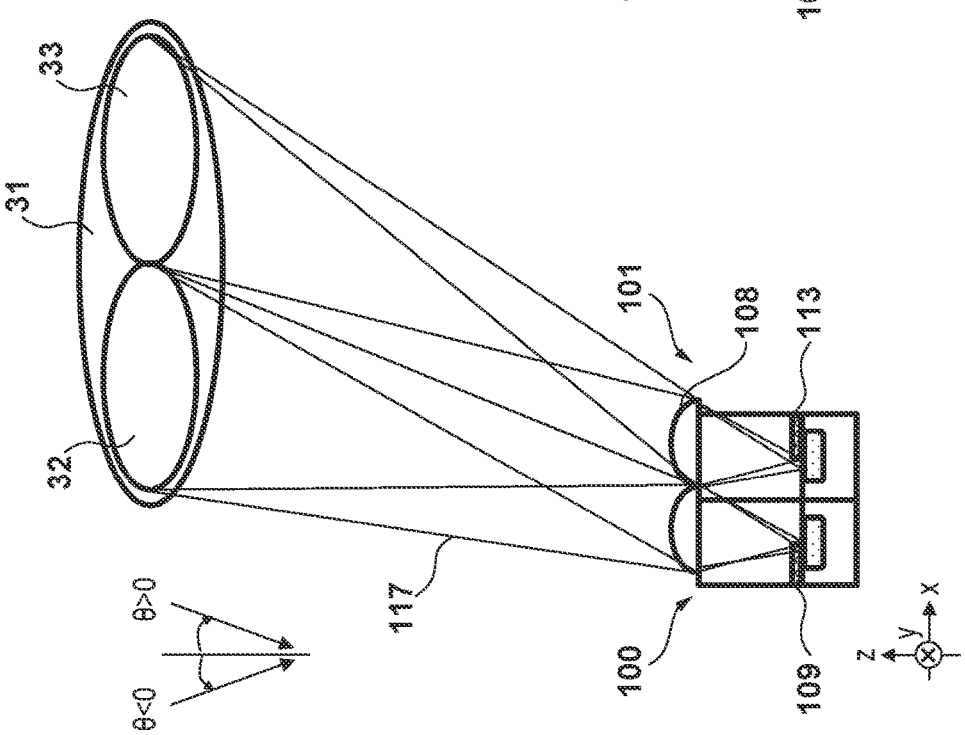

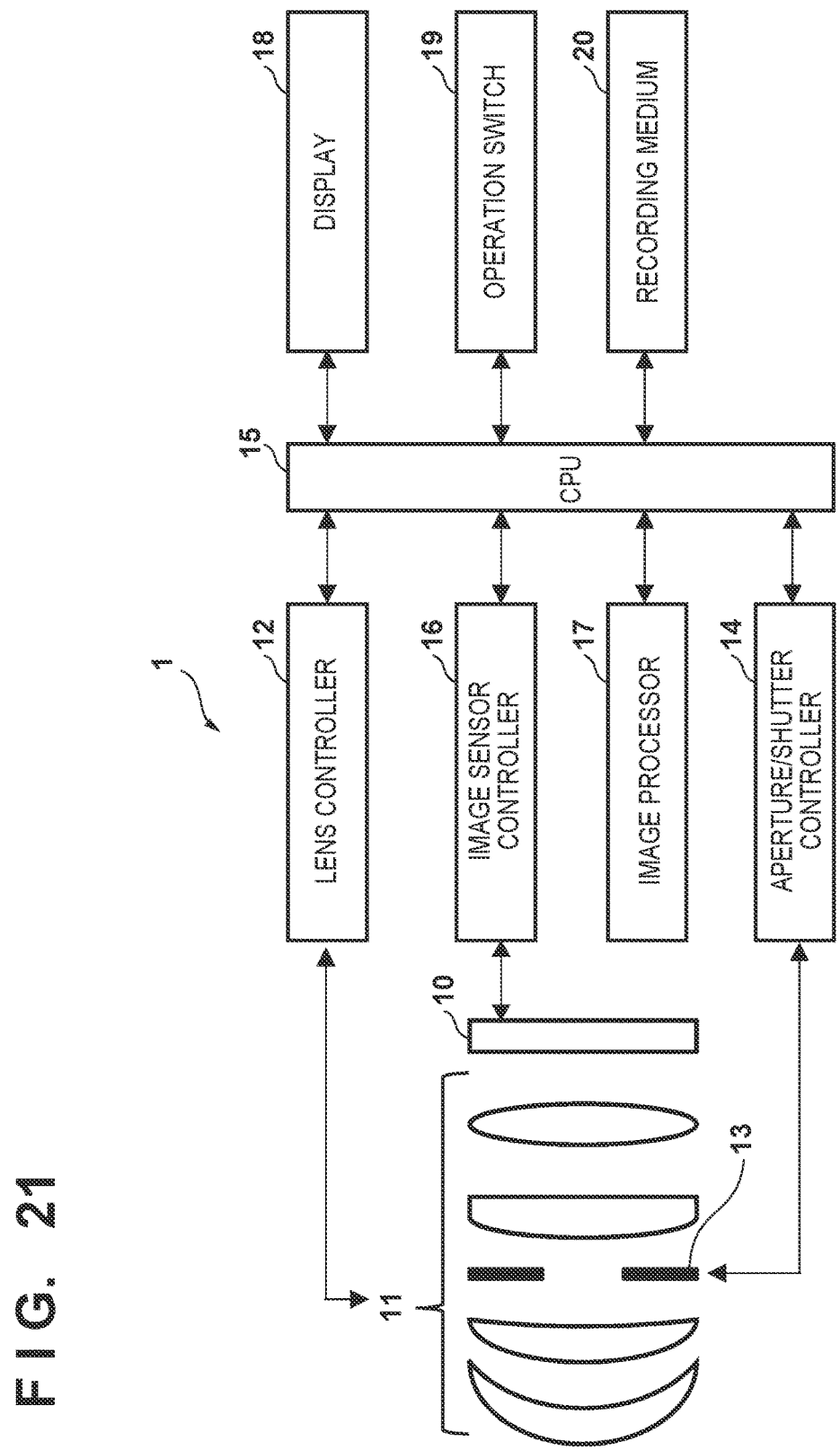

SOLID-STATE IMAGE SENSOR AND CAMERA WITH PIXEL OPENINGS

BACKGROUND OF THE INVENTION

Field of the Invention

The present invention relates to a solid-state image sensor and camera.

Description of the Related Art

A solid-state image sensor such as a CCD image sensor or a CMOS image sensor is used in a camera such as a video camera or an electronic still camera. Some solid-state image sensors include focus detection pixels. Japanese Patent Laid-Open No. 2013-157883 discloses a solid-state image sensor in which a light blocking portion covering almost half the region of a photoelectric converter is arranged on the photoelectric converter. In such a solid-state image sensor, light having passed through the first region of the pupil of an imaging optical system enters focus detection pixels of the first group, and light having passed through the second region of the pupil enters focus detection pixels of the second group. Focus detection is performed (defocus amount is detected) based on an image detected by the focus detection pixels of the first group and the focus detection pixels of the second group.

When the light blocking portion is provided to cover almost half the region of the photoelectric converter, the edge of an image detected by the focus detection pixels of each group becomes flat in a region where the image height is large, and the focus detection performance may drop or focus detection may fail.

SUMMARY OF THE INVENTION

The present invention provides a technique advantageous for focus detection in a region where the image height is large.

One aspect of the present invention provides a solid-state image sensor comprising a plurality of pixels for focus detection, each of the pixels including a photoelectric converter arranged in a semiconductor substrate, a microlens, and a light blocking portion arranged between the semiconductor substrate and the microlens to cover part of the photoelectric converter, wherein a face in the pixel, which is parallel to a surface of the semiconductor substrate and on which the light blocking portion is arranged, includes a first opening and a second opening in addition to the light blocking portion, the light blocking portion includes a separator that has a light blocking property and is arranged between the first opening and the second opening, the second opening is larger in area than the first opening, and the light blocking portion is larger in area than the first opening.

Further features of the present invention will become apparent from the following description of exemplary embodiments with reference to the attached drawings.

BRIEF DESCRIPTION OF THE DRAWINGS

FIGS. 4A to 4C are views showing the arrangements of the focus detection pixels in the solid-state image sensor according to the embodiment of the present invention;

FIGS. 5A and 5B are views showing the relationship between the solid-state image sensor and the exit pupil of an imaging optical system;

FIGS. 6A and 6B are views for explaining the solid-state image sensor according to the embodiment of the present invention;

FIGS. 11A and 11B are enlarged views showing parts of FIGS. 10A and 10B;

FIGS. 14A and 14B are enlarged views showing parts of FIGS. 13A and 13B;

FIGS. 15A to 15C are views for explaining a solid-state image sensor according to the embodiment of the present invention;

FIGS. 16A to 16H are views for explaining a solid-state image sensor according to an embodiment of the present invention;

FIGS. 17A and 17B are views for explaining a solid-state image sensor according to the embodiment of the present invention;

FIG. 18 is a view for explaining the layout of focus detection pixels in the solid-state image sensor according to the embodiment of the present invention;

FIGS. 20A and 20B are views showing the relationship between the solid-state image sensor and the exit pupil of the imaging optical system; and FIG. 21 is a view showing the arrangement of a camera according to an embodiment of the present invention.

DESCRIPTION OF THE EMBODIMENTS

Although the present invention will be explained throughout exemplary embodiments with reference to the accompanying drawings, the present invention is not limited to the following embodiments.

Figure 1:
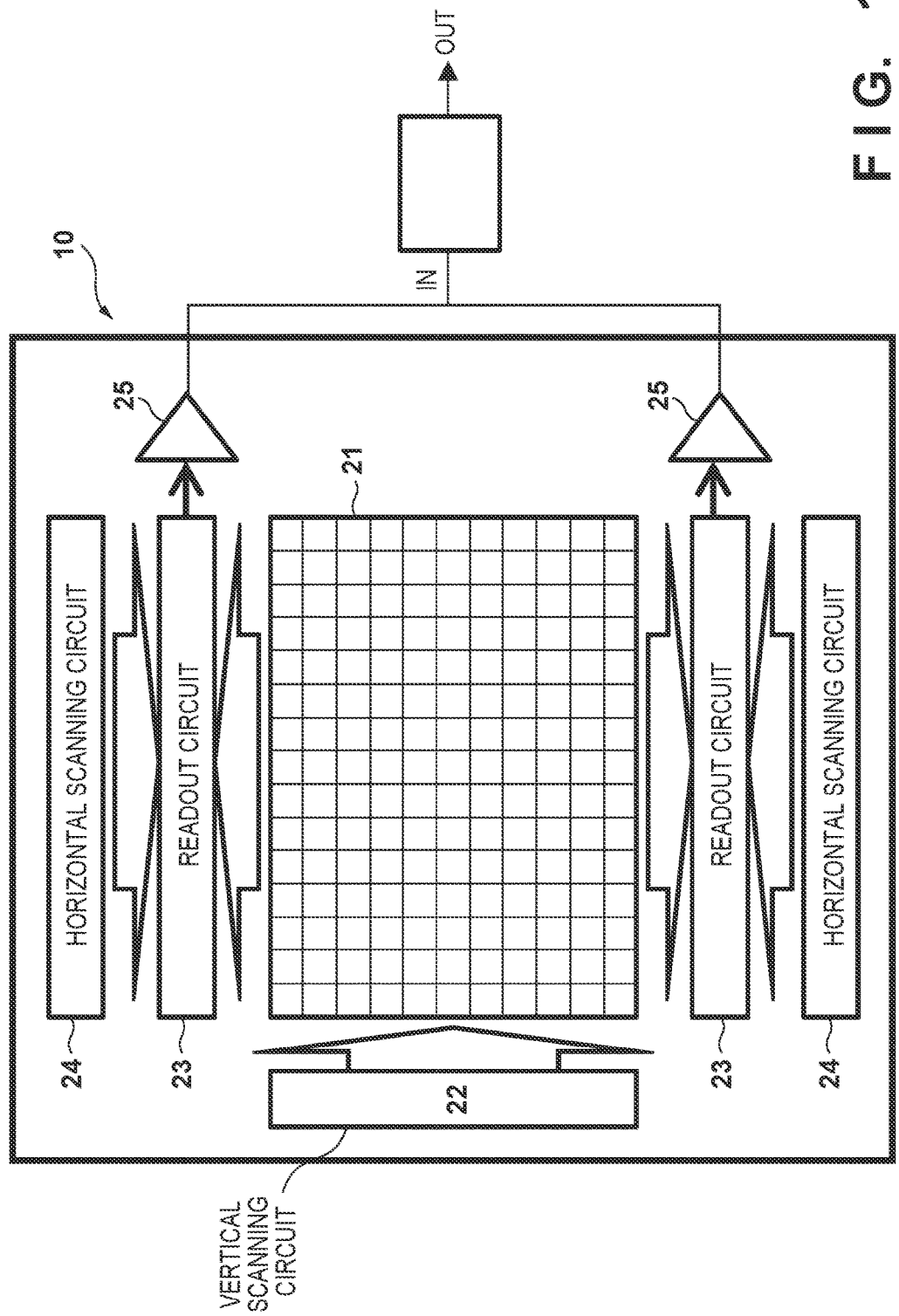
FIG. 1 is a view showing the arrangement of a solid-state image sensor according to an embodiment of the present invention.

FIG. 1 shows the arrangement of a solid-state image sensor 10 according to the first embodiment of the present invention. The solid-state image sensor 10 is a solid-state image sensor including focus detection pixels serving as pixels for focus detection. The solid-state image sensor 10 can include, for example, a pixel region 21, a vertical scanning circuit (vertical selecting circuit) 22, two readout circuits 23, two horizontal scanning circuits (horizontal selecting circuits) 24, and two output amplifiers 25. A region excluding the pixel region 21 can be called a peripheral circuit region. In the pixel region 21, a plurality of pixels are arrayed two-dimensionally. The plurality of pixels include a plurality of imaging pixels and a plurality of focus detection pixels. Each readout circuit 23 can include, for example, a column amplifier, a correlated double sampling (CDS) circuit, and an addition circuit. The readout circuit 23 performs processes such as amplification and addition on signals read out via vertical signal lines from pixels of a row selected by the vertical scanning circuit 22. Each horizontal scanning circuit 24 generates a column selecting signal for sequentially reading out signals based on pixel signals from the readout circuit 23. Each output amplifier 25 amplifies and outputs a signal of a column selected by the horizontal scanning circuit 24.

Figure 2A:
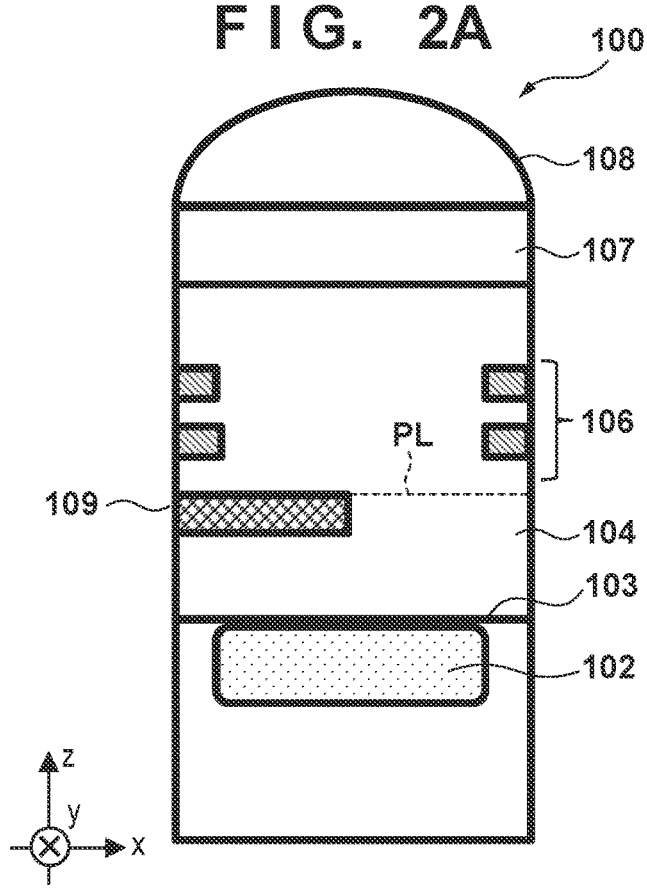
FIGS. 2A and 2B are views showing the arrangement of a focus detection pixel in the solid-state image sensor according to the embodiment of the present invention.
Figure 2B:
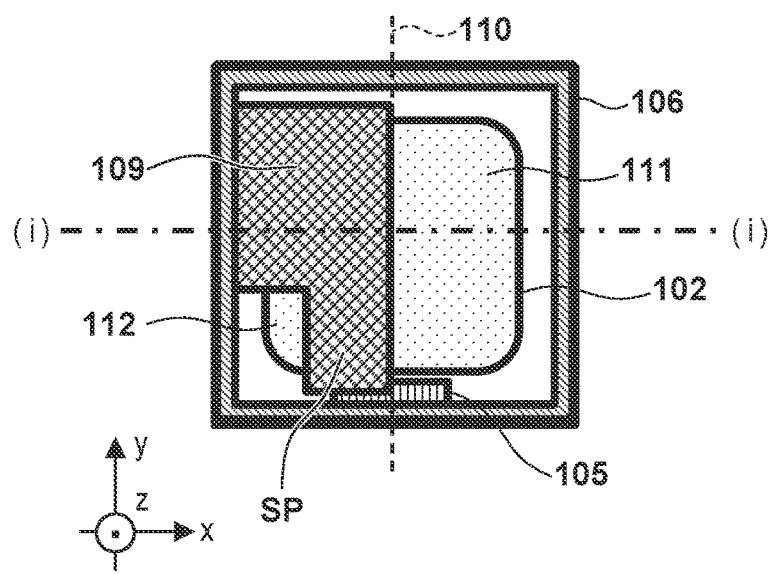
Figure 3A:
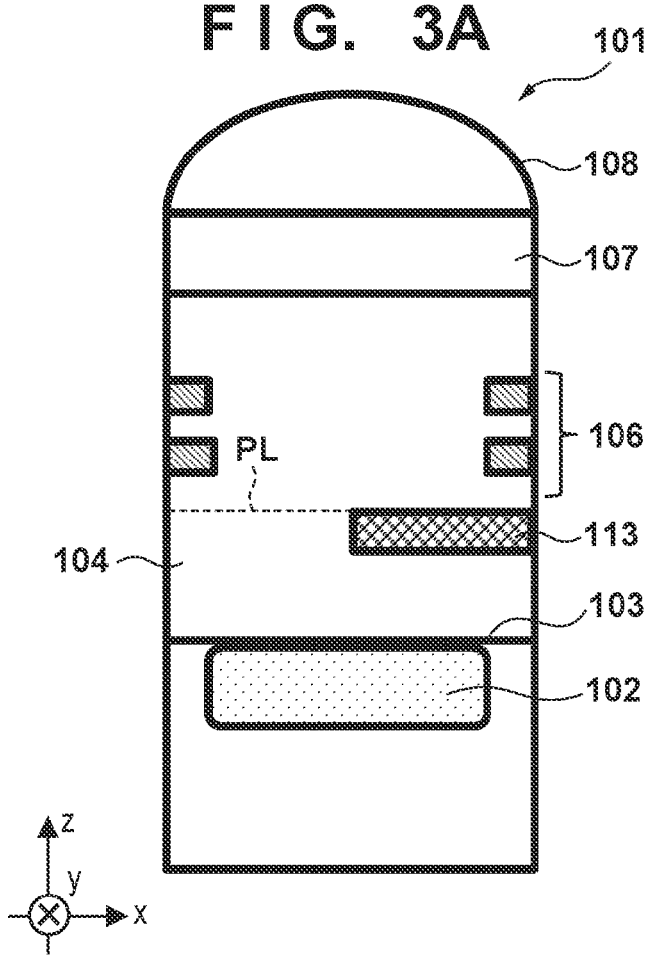
FIGS. 3A and 3B are views showing the arrangement of a focus detection pixel in the solid-state image sensor according to the embodiment of the present invention.
Figure 3B:
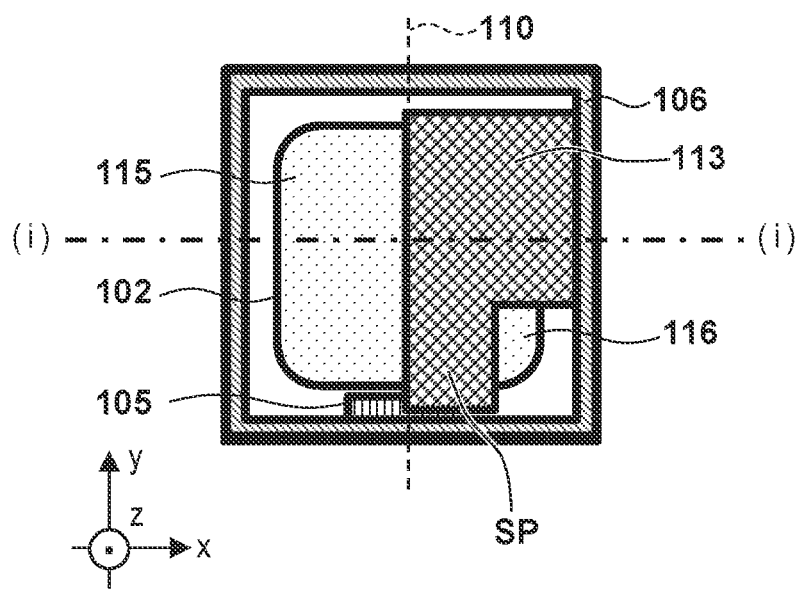

FIGS. 2A, 2B, 3A, and 3B show the arrangements of a first focus detection pixel 100 and second focus detection pixel 101 in the solid-state image sensor 10 according to the first embodiment, respectively. FIGS. 2B and 3B are plan views of the focus detection pixels 100 and 101, and FIGS. 2A and 3A are sectional views taken along lines (i)-(i) in FIGS. 2B and 3B, respectively.

The first focus detection pixel 100 is configured to detect light having passed through the first region of the pupil of an imaging optical system (not shown). The second focus detection pixel 101 is configured to detect light having passed through the second region of the pupil of the imaging optical system. The first focus detection pixel 100 includes a photoelectric converter 102 arranged in a semiconductor substrate 103, a microlens 108, and a light blocking portion 109 arranged between the semiconductor substrate 103 and the microlens 108 to cover part of the photoelectric converter 102. The photoelectric converter 102 is formed by, for example, doping an impurity into the semiconductor substrate 103. The second focus detection pixel 101 includes the photoelectric converter 102 arranged in the semiconductor substrate 103, the microlens 108, and a light blocking portion 113 arranged between the semiconductor substrate 103 and the microlens 108 to cover part of the photoelectric converter 102. The photoelectric converter 102 is formed by, for example, doping an impurity into the semiconductor substrate 103.

The solid-state image sensor 10 or the focus detection pixels 100 and 101 according to the first embodiment can further include an insulating film 104 arranged between the microlens 108 and the semiconductor substrate 103, and a color filter 107 arranged between the insulating film 104 and the microlens 108. The light blocking portions 109 and 113 can be arranged in the insulating film 104. The color filter 107 may include a planarizing layer.

In the first focus detection pixel 100, a face PL which is parallel to the surface of the semiconductor substrate 103 and on which the light blocking portion 109 is arranged includes a first opening 112 and a second opening 111 in addition to the light blocking portion 109. The second opening 111 is preferably larger in area than the first opening 112. The light blocking portion 109 includes a separator SP that has a light blocking property and is arranged between the first opening 112 and the second opening 111. In the second focus detection pixel 101, the face PL which is parallel to the surface of the semiconductor substrate 103 and on which the light blocking portion 113 is arranged includes a first opening 116 and a second opening 115 larger in area than the first opening 116, in addition to the light blocking portion 113. The light blocking portion 113 includes the separator SP that has a light blocking property and is arranged between the first opening 116 and the second opening 115.

The solid-state image sensor 10 or the focus detection pixels 100 and 101 according to the first embodiment can further include wiring layers 106 between the face PL and the microlens 108 in the insulating film 104. Each of the focus detection pixels 100 and 101 can further include a transfer gate (transfer transistor) 105 in which a channel for transferring charges generated in the photoelectric converter 102 is formed in the semiconductor substrate 103. The separator SP can be arranged to cover part of the transfer gate 105. Boundary lines 110 between the second openings 111 and 115 and the light blocking portions 109 and 113 can be perpendicular to the direction of length of the channel formed by the transfer gate 105 (direction in which the transfer gate transfers charges). Contact plugs may be arranged in the first openings 112 and 116.

The insulating film 104 is typically transparent. Although the insulating film 104 may be a monolayer film made of one type of material, the insulating film 104 can be typically a multilayer film formed by stacking a plurality of layers made of different materials. A given layer of the insulating film 104 can be made of, for example, silicon oxide ($SiO_2$). Another layer of the multilayer film constituting the insulating film 104 can be made of silicon nitride ($Si_3N_4$) or silicon carbide (SiC).

The wiring layer 106 can be typically multilayer wiring. A conductive material such as copper, aluminum, tungsten, tantalum, titanium, or polysilicon can be used for the wiring layer 106. The typical wiring layer 106 is opaque and has metallic luster. The same layer as the light blocking portions 109 and 113 may be used as wiring. The transfer gate 105 can be made of, for example, polysilicon. The transfer gate 105 can be connected to the wiring layer 106 via a contact plug. The color filter 107 and the microlens 108 are arranged. The color filter 107 is an absorption filter that transmits R (Red), G (Green), or B (Blue) light. The color filter 107 may be a W (White) filter that transmits beams of the R, G, and B wavelengths, or a filter that transmits IR (Infrared Ray). The color filter 107 may include a planarizing layer in order to improve the stability of the filter.

In this specification and the accompanying drawings, the direction is expressed by the x-y-z coordinate system. A direction perpendicular to the surface of the semiconductor substrate 103 (direction from the semiconductor substrate 103 toward the microlens 108) is defined as the z direction. A face that is perpendicular to the z direction and parallel to the surface of the semiconductor substrate 103 is defined as the x-y face. The x and y directions are perpendicular to each other.

The focus detection pixels 100 and 101 are paired. The focus detection pixel 100 includes the light blocking portion 109 on the left side (−x direction side) of the region of the focus detection pixel 100. The focus detection pixel 101 includes the light blocking portion 113 on the right side (+x direction) of the region of the focus detection pixel 101.

The light blocking portion 109 can also be understood as a member that defines the first opening 112 and the second opening 111. In the example shown in FIGS. 2A, 2B, 3A, and 3B, the first opening 112, the separator SP, and the second opening 111 are aligned in the x direction, and the first opening 116 and the second opening 115 are also aligned in the x direction. That is, the example shown in FIGS. 2A, 2B, 3A, and 3B is an example of pixels that perform focus detection on an imaging pattern having grayscale in the x direction. If focus detection pixels in which the light blocking portions 109 and 113 are rotated by 90° and arranged are used, focus detection can be performed on an imaging pattern having grayscale in the y direction.

FIGS. 4A to 4C show the focus detection pixels 100 and 101 arranged in the peripheral region of the pixel region 21, and the focus detection pixels 100 and 101 arranged in the central region of the pixel region 21. FIG. 4B shows the section of the focus detection pixels 100 and 101 arranged in the peripheral region of the pixel region 21. FIG. 4C shows the section of the focus detection pixels 100 and 101 arranged in the central region of the pixel region 21. In a focus detection pixel arranged closer to the peripheral side, the microlens 108 can be shifted much more toward the center side and arranged. This can increase rays entering the photoelectric converter 102 of the focus detection pixel and improve the focus detection performance.

FIGS. 5A and 5B schematically show the geometrical relationship between a pupil (exit pupil) 31 of the imaging optical system and the focus detection pixels 100 and 101. In this example, the x direction is the pupil division direction. The pupil 31 includes a divided first region 33 and second region 32. It is desired that rays traveling from the first region 33 are dominant among rays entering the focus detection pixel 101, and rays traveling from the second region 32 are dominant among rays entering the focus detection pixel 100.

FIGS. 5A and 5B show a state in which light enters the focus detection pixels 100 and 101 in the peripheral region (FIG. 4B) within the pixel region 21. The angles of beams entering the focus detection pixels 100 and 101 change depending on the distances (to be referred to as pupil distances hereinafter) from the position of the pupil 31 of the imaging optical system to the focus detection pixels 100 and 101. FIG. 5A shows a case in which the incident angle of incident light 117 matches the shift amount of the microlens 108. FIG. 5B shows a case in which the pupil distance is shorter than that in FIG. 5A and the incident angle is large with respect to the shift amount of the microlens 108.

FIGS. 6A and 6B are enlarged views of the focus detection pixels 100 and 101 in FIGS. 5A and 5B. In this case, an incident angle θ from the +x direction to the −z direction is set to be θ>0, and an incident angle from the −x direction to the −z direction is set to be θ<0. Since the incident angle of the incident light 117 matches the shift amount of the microlens 108, the condensing center of the incident light 117 exists on the boundary between the second opening 111 and the light blocking portion 109 and the boundary between the second opening 115 and the light blocking portion 113. Since the incident angle of incident light 118 does not match the shift amount of the microlens 108, the condensing center shifts from each boundary mentioned above. In the first embodiment, the focus detection accuracy is improved even in a region where the relationship between the shift of the microlens and the incident angle is improper.

The relationship between the incident angle distributions of the focus detection pixels 100 and 101 and the opening (aperture) of the pupil (exit pupil) of the imaging optical system will be explained. Images in the regions 32 and 33 within the pupil 31 in FIGS. 5A and 5B correspond to the incident angle distributions of the focus detection pixels 100 and 101. The incident angle distributions of the focus detection pixels 100 and 101 are defined as an A image and a B image, respectively.

Figure 7A:
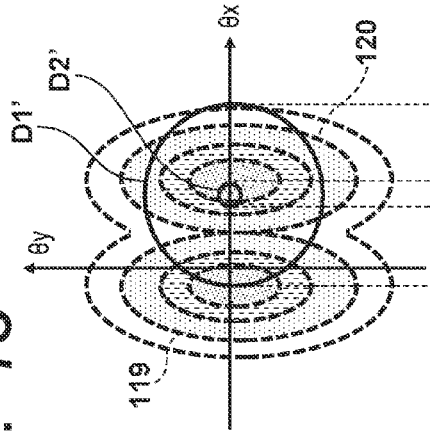
FIGS. 7A to 7D are graphs for explaining an incident angle distribution in the solid-state image sensor according to the embodiment of the present invention.
Figure 7C:
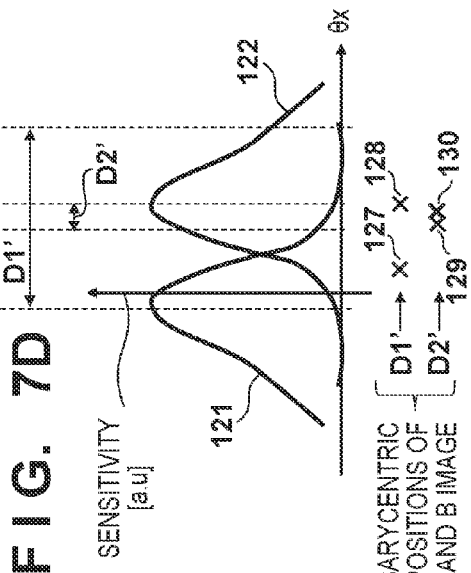
Figure 7B:
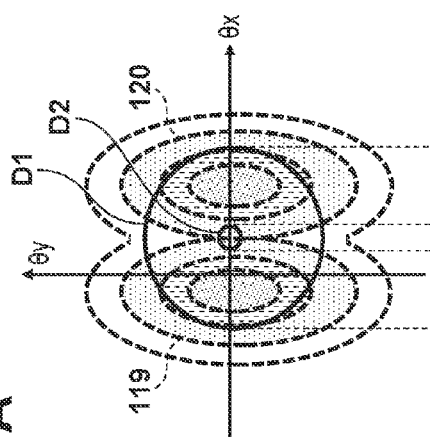
Figure 7D:
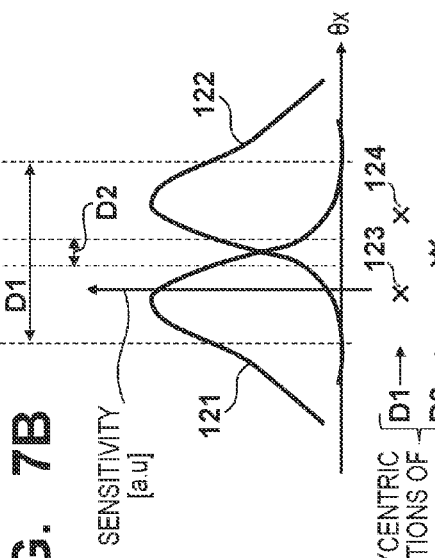

An A image 119 in FIGS. 7A and 7C is the contour drawing of an incident angle distribution determined by the focus detection pixel 100. A B image 120 in FIGS. 7A and 7C is the contour drawing of an incident angle distribution determined by the focus detection pixel 101. Incident angles in the x and y directions are represented by θx and θy, respectively. FIGS. 7B and 7D show projection data with respect to θx in FIGS. 7A and 7C. The abscissa indicates the incident angle θx, and the ordinate indicates the sensitivity [a.u.]. When the microlens 108 is shifted in the x direction (y direction), the incident angle distribution is translated in the θx (θy) direction.

In FIGS. 7A to 7D, D1, D2, D1', and D2' represent angle regions where light enters. The angle region is determined by the opening (aperture) of the exit pupil of an imaging optical system 11 (see FIG. 21). D1 and D1' are incident angle regions when the aperture of the imaging optical system 11 is set to a full-aperture state (for example, f1.4). D2 and D2' are incident angle regions when the aperture is narrowed (for example, f8). The incident angle changes depending on the pupil distance of the imaging optical system 11. In FIGS. 7A and 7B, D1 and D2 represent a case in which the incident angle θx of the incident light 117 matches the shift amount of the microlens 108. In FIGS. 7C and 7D, D1' and D2' represent a case in which the incident angle θx is large with respect to the shift amount of the microlens 108. To obtain the focus detection performance, it is necessary that the barycentric positions of the A and B images are spaced apart from each other in the incident light angle regions D1 and D2 determined by the aperture (f-number).

The barycentric position of a function F(θ) in an interval [a,b] is defined by:

$$\frac{\int_a^b \theta F(\theta) d\theta}{\int_a^b F(\theta) d\theta} \quad (1)$$

In FIG. 7B, reference numerals 123 and 124 denote barycentric positions (abscissa: θx) of the A and B images in the angle region of D1, respectively. Reference numerals 125 and 126 denote barycentric positions (abscissa: θx) of the A and B images in the angle region of D2, respectively. In FIG. 7D, reference numerals 127 and 128 denote barycentric positions (abscissa: θx) of the A and B images in the angle region of D1', respectively. Reference numerals 129 and 130 denote barycentric positions (abscissa: θx) of the A and B images in the angle region of D2', respectively.

When the distance between the barycenters of the A and B images is large, the focus detection performance can be improved. Basically, when the aperture is in a full-aperture state (f-number is small), the integration interval is widened, the distance between the barycenters is increased, and the focus detection performance becomes good. To the contrary, in the angle regions D2 and D2' in which the aperture is narrowed (f-number is large), the integration interval is narrow, and the distance between the barycenters of the A and B images tends to be short. Since the incident angle of light changes depending on the pupil distance of the imaging optical system 11, the distance between the barycenters also changes along with this.

Especially when the incident angle θx is large with respect to the shift amount of the microlens 108, the sensitivity changes of the A and B images in the interval become small in the angle interval D2' than that in the angle interval D2, the distance between the barycenters becomes small qualitatively, and the focus detection accuracy drops. In the first embodiment, the focus detection accuracy in this region is improved.

Figure 8A:
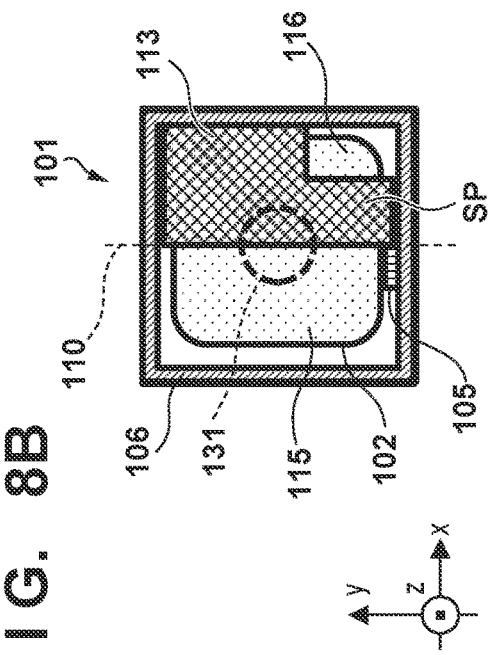
FIGS. 8A to 8D are views for explaining the solid-state image sensor according to the embodiment of the present invention.
Figure 8B:
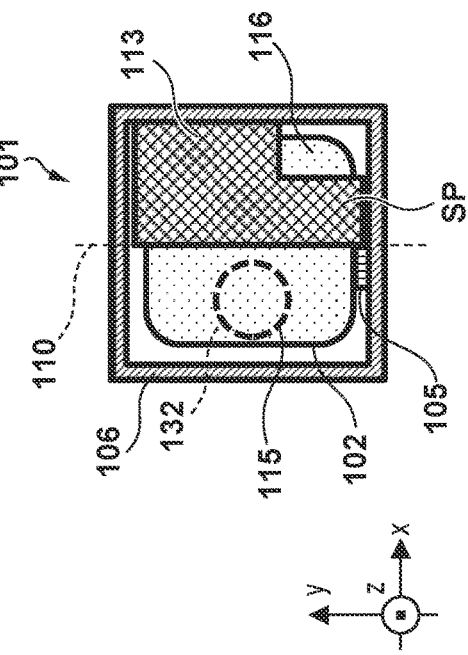

FIGS. 8A and 8B show condensed spots 131 of light condensed on the light blocking portions 109 and 113 when the incident angle θx is large with respect to the shift amount of the microlens 108. When the incident angle is large with respect to the shift amount of the microlens 108, the condensed spots of light condensed on the light blocking portions 109 and 113 of the focus detection pixels 100 and 101 change to be condensed spots 132 in FIGS. 8C and 8D. The condensed spot has a certain width owing to diffraction in wave optics.

Figure 9A:
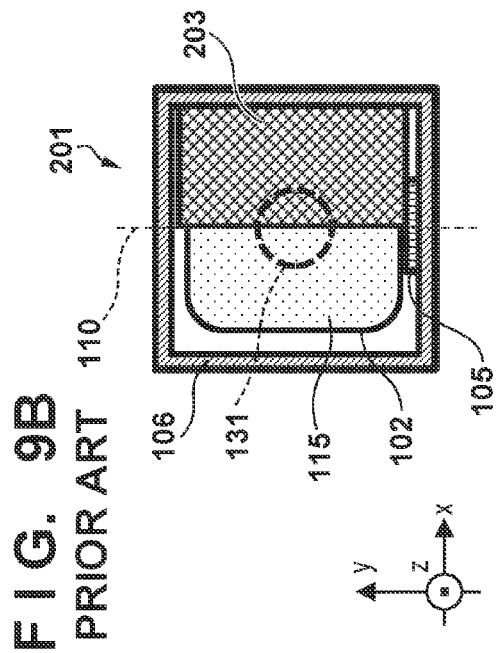
FIGS. 9A to 9D are views for explaining a solid-state image sensor according to the prior art.
Figure 9B:
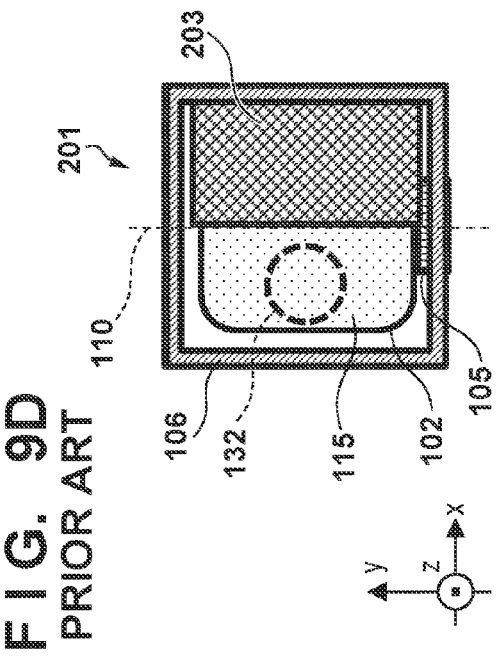
Figure 9C:
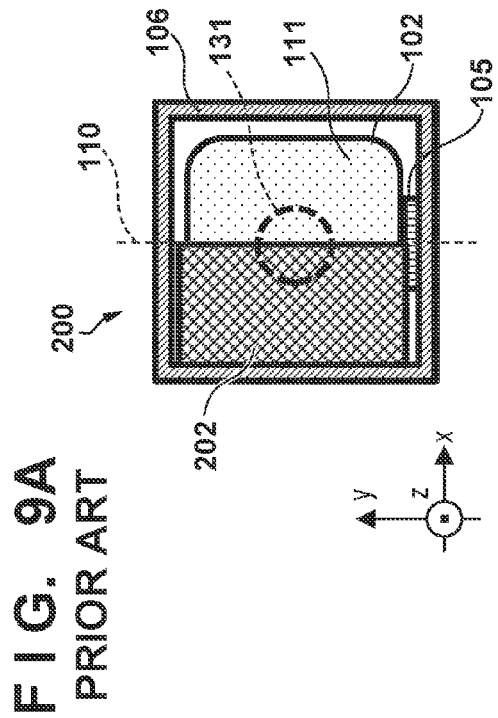
Figure 9D:
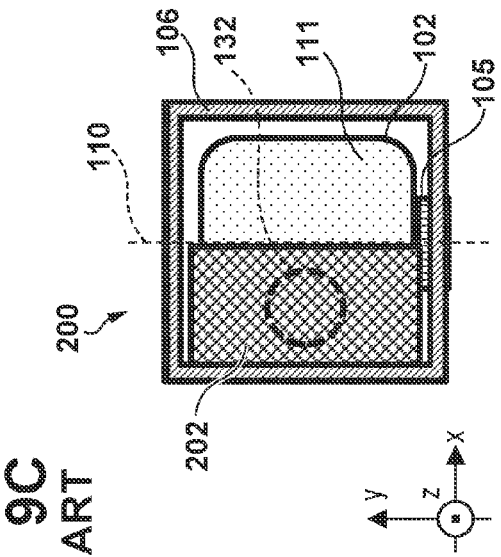

FIGS. 9A to 9D show light blocking portions according to the prior art. Light blocking portions 202 and 203 in FIGS. 9A to 9D each cover almost half the region of the photoelectric converter 102. In the first embodiment, the light blocking portions 109 and 113 are configured to form the openings 112 and 116. FIGS. 9A and 9B show the condensed spots 131 formed on the light blocking portions 202 and 203 of focus detection pixels 200 and 201 when the shift amount of the microlens 108 and the incident angle θ match each other. FIGS. 9C and 9D show the condensed spots 132 formed on the light blocking portions 202 and 203 when the incident angle θ is large with respect to the shift amount of the microlens 108.

The relationship between the shape of the light blocking portion and the distance between the barycenters of the A and B images will be explained below. The focus detection pixels 100 and 101 (FIGS. 8A to 8D) respectively including the light blocking portions 109 and 113 according to the first embodiment, and the focus detection pixels 200 and 201 (FIGS. 9A to 9D) respectively including the light blocking portions 202 and 203 according to the prior art are compared here.

Figure 10A:
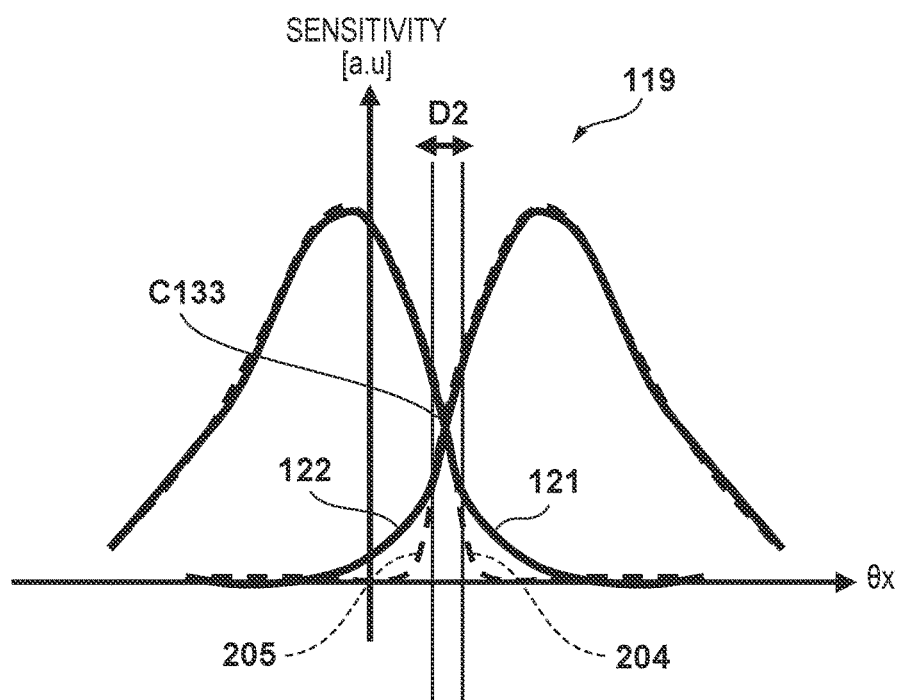
FIGS. 10A and 10B are graphs for explaining incident angle distributions in the solid-state image sensor according to the embodiment of the present invention and the solid-state image sensor according to the prior art.
Figure 10B:
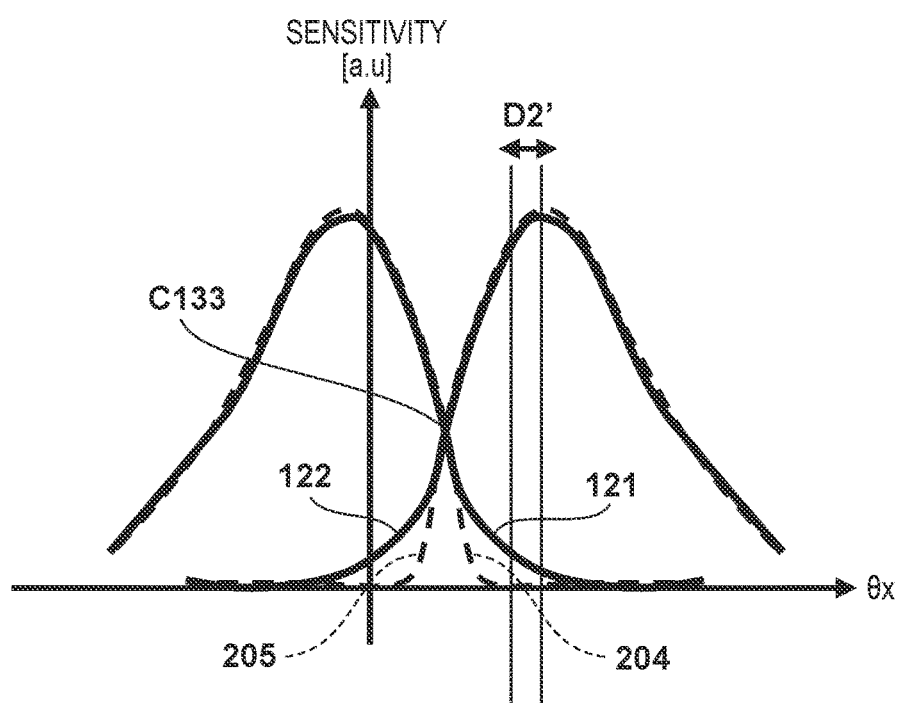

FIGS. 10A and 10B show incident angle distributions A 121 and B 122 (solid lines) of the focus detection pixels 100 and 101 according to the first embodiment, and incident angle distributions A 204 and B 205 (broken lines) of the focus detection pixels 200 and 201 according to the prior art, which are superimposed on each other. D2 represents the angle region D2 when the aperture is narrowed (for example, f8). D2 in FIG. 10A corresponds to a case in which the incident angle of light matches the shift amount of the microlens 108. D2' in FIG. 10B corresponds to a case in which the incident angle of light is large with respect to the shift amount of the microlens 108.

FIG. 11A shows extractions of the A and B images in the angle region D2 of FIG. 10A. Reference numerals 125 and 126 denote the barycentric positions of the A and B images in the angle region D2 in the focus detection pixels 100 and 101 according to the first embodiment. Reference numerals 206 and 207 denote the barycentric positions of the A and B images in the focus detection pixels 200 and 201 according to the prior art. FIG. 11B shows extractions of the A and B images in the angle region D2' of FIG. 10B. Reference numerals 127 and 128 denote the barycentric positions of the A and B images in the angle region D2 in the focus detection pixels 100 and 101 according to the first embodiment. Reference numerals 208 and 209 denote the barycentric positions of the A and B images in the focus detection pixels 200 and 201 according to the prior art.

Figure 8C:
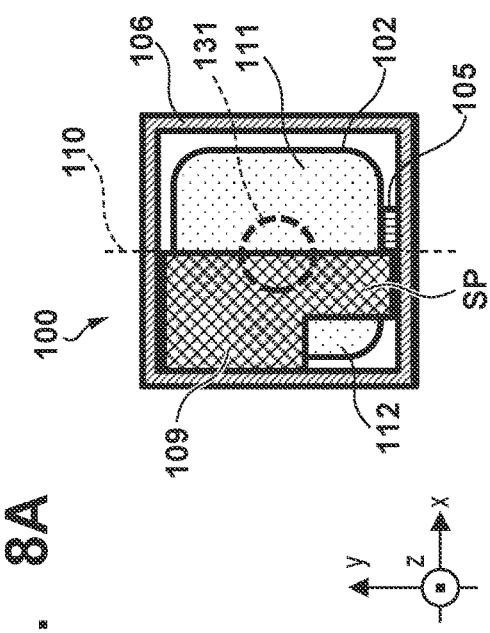

The shapes of the A and B images depend on the shape of the light blocking portion. In the case of the light blocking portions 202 and 203 according to the prior art, when the position of the condensed spot 132 shifts from the boundary line 110, as shown in FIG. 9C, most of light is blocked by the light blocking portion 202. If a cross point C 133 between the A image 204 and the B image 205 in FIGS. 10A and 10B deviates from the boundary line 110, the sensitivity abruptly drops. To the contrary, in the case of the light blocking portions 109 and 113 according to the first embodiment, when the position of the condensed spot 132 shifts from the boundary line 110, as shown in FIG. 8C, light enters the photoelectric converter 102 through the opening 112.

There is almost no change of the sensitivity in the A image 204 and B image 205 according to the prior art in the angle region D2', so the barycentric position depends on the center value of the angle interval and the distance between the barycenters becomes small. In the first embodiment, especially the A image out of the A image 121 and B image 122 is a region where the sensitivity changes, the barycentric position is spaced apart from the center value of the angle interval, and the distance between the barycenters of the A and B images can be increased.

FIGS. 12A to 12D are schematic views for examining focus detection pixels shown in FIG. 8 of Japanese Patent Laid-Open No. 2013-157883. FIGS. 12A to 12D show a focus detection pixel 300 including a light blocking portion 302, and a focus detection pixel 301 including a light blocking portion 303. The light blocking portions 302 and 303 in FIGS. 12A to 12D are configured so that an opening 304 is merged with the opening 111 and an opening 305 is merged with the opening 115.

Figure 12A:
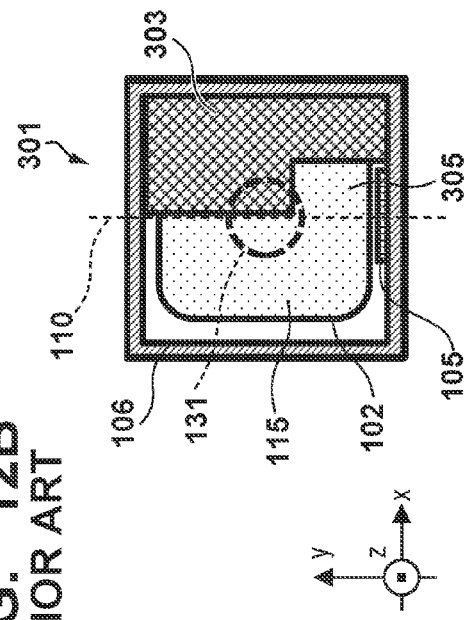
FIGS. 12A to 12D are views for explaining a solid-state image sensor according to the prior art.
Figure 12B:
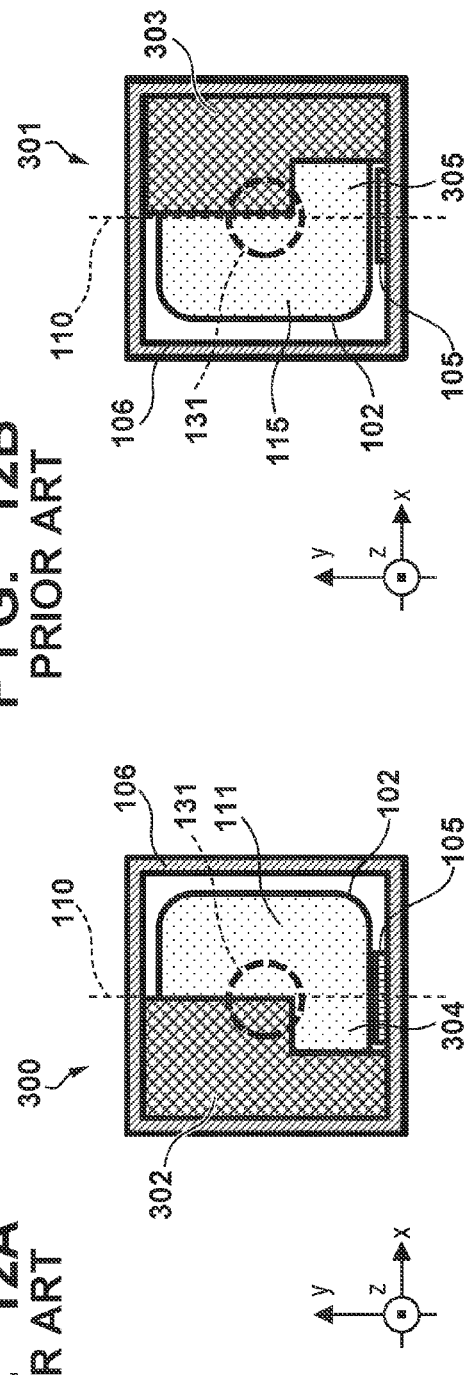
Figure 12C:
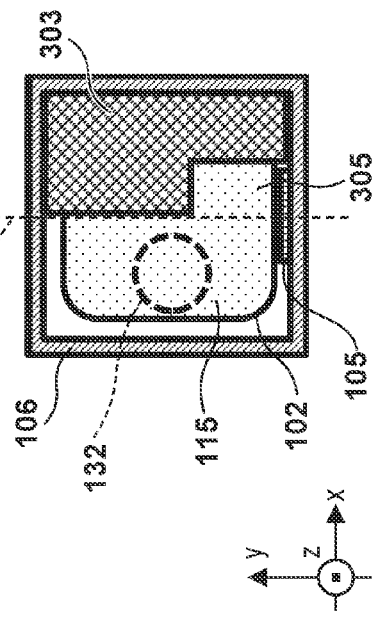
Figure 12D:
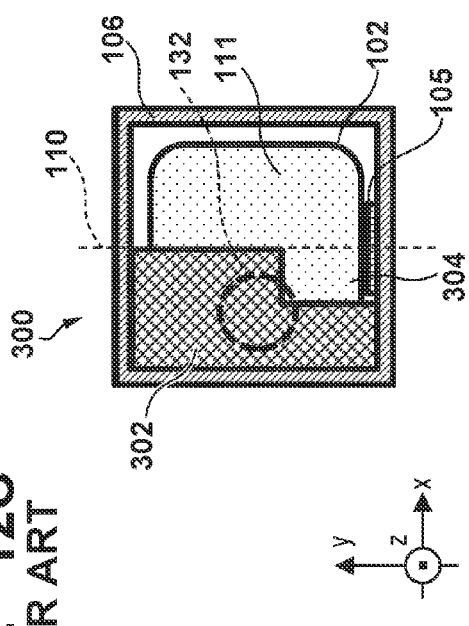
Figure 13A:
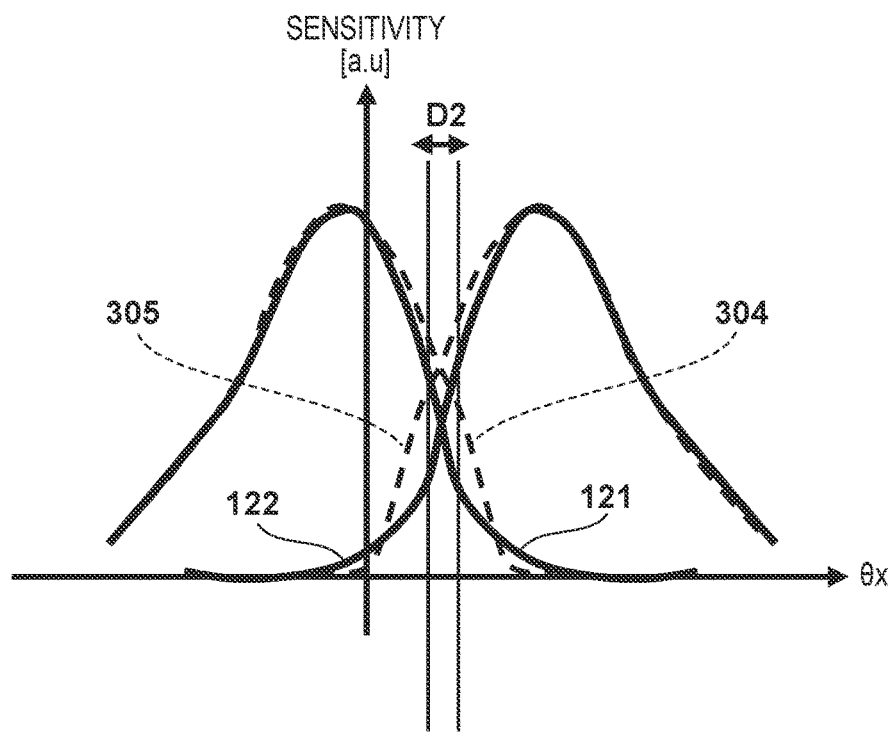
FIGS. 13A and 13B are graphs for explaining incident angle distributions in the solid-state image sensor according to the embodiment of the present invention and the solid-state image sensor according to the prior art.
Figure 13B:
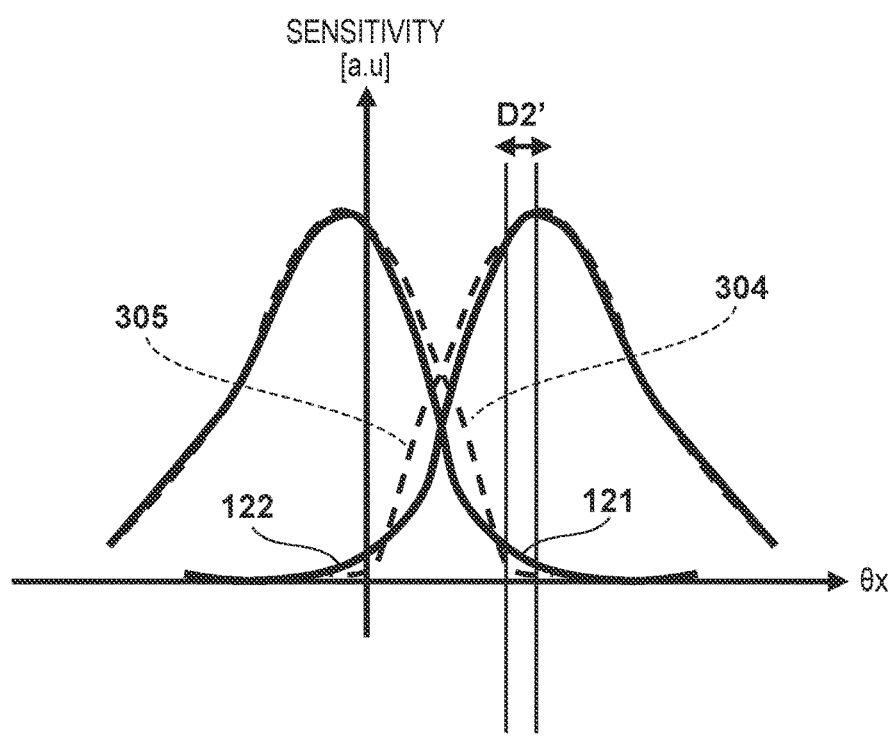

FIGS. 12A and 12B show the condensed spots 131 formed on the light blocking portions 302 and 303 of the focus detection pixels 300 and 301 when the shift amount of the microlens 108 and the incident angle θ match each other. FIGS. 12C and 12D show the condensed spots 132 formed on the light blocking portions 302 and 303 when the incident angle is large with respect to the shift amount of the microlens 108. FIGS. 13A and 13B show incident angle distributions (A image and B image) 121 and 122 (solid lines) of the focus detection pixels 100 and 101 according to the first embodiment, and incident angle distributions (A image and B image) 304 and 305 (broken lines) of the focus detection pixels 300 and 301 according to the prior art, which are superimposed on each other. D2 represents the angle region D2 when the aperture is narrowed (for example, f8).

D2 in FIG. 13A corresponds to a case in which the incident angle θx of light matches the shift amount of the microlens 108. D2' in FIG. 13B corresponds to a case in which the incident angle θx of light is large with respect to the shift amount of the microlens 108. FIG. 14A shows extractions of the A image 121 and B image 122 in the angle region D2 of FIG. 13A. Reference numerals 125 and 126 denote the barycentric positions of the A image 121 and B image 122 in the angle region D2 in the focus detection pixels 100 and 101 according to the first embodiment. Reference numerals 306 and 307 denote the barycentric positions of the A image 304 and B image 305 in the focus detection pixels 300 and 301 according to the prior art. FIG. 14B shows extractions of the A and B images in the angle region D2' of FIG. 13B. Reference numerals 127 and 128 denote the barycentric positions of the A image 121 and B image 122 in the angle region D2 in the focus detection pixels 100 and 101 according to the first embodiment. Reference numerals 308 and 309 denote the barycentric positions of the A image 304 and B image 305 in the focus detection pixels 300 and 301 according to the prior art.

The shapes of the A and B images depend on the shape of the light blocking portion. In the case of the light blocking portions 302 and 303 according to the prior art, the condensed spots 131 partially leak from the openings 304 and 305 and enter the photoelectric converters 102, as shown in FIGS. 12A and 12B in which the incident angle and the shift amount of the microlens 108 match each other. In the A image 304 and B image 305 according to the prior art shown in FIG. 14A, the change of the sensitivity with respect to the incident angle θx becomes more gradual in comparison with the A image 121 and B image 122 of the first embodiment, and the gradient becomes smaller. As a result, the barycentric positions 306 and 307 of the A and B images according to the prior art come closer to each other in comparison with the barycentric positions 125 and 126 of the A and B images in the first embodiment, and the distance between the barycenters becomes short. In FIG. 14B, the distance between the barycenters becomes larger in the first embodiment than in the prior art because of the same reason as that in FIG. 11B. Hence, the focus detection performance is higher in the first embodiment than in the prior art. As a result, the distance between the barycenters becomes larger in the first embodiment than in the prior art, and the A and B images can be clearly separated, improving the focus detection performance.

When the size of each of the focus detection pixels 100 and 101 is equal to or smaller than 10 μm, it is preferable that the second opening 111 is larger in area than the first opening 112 and the second opening 115 is larger in area than the first opening 116. Further, it is preferable that the light blocking portion 109 is larger in area than the first opening 112 and smaller in area than the second opening 111, and the light blocking portion 113 is larger in area than the first opening 116 and smaller in area than the second opening 115.

With the above-described arrangement, when the condensed spots 131 exist near the boundary lines 110 in the focus detection pixels 100 and 101 according to the first embodiment, as shown in FIGS. 8A to 8D, the light blocking portions 109 and 113 block almost half the condensed spots 131. In the case of the condensed spots 131 shifted from the boundary lines 110, part of light can enter the photoelectric converters 102 through the openings 112 and 116. As a result, the A and B images can be clearly separated, improving the focus detection performance.

An example of the case in which the angle of incident light is large with respect to the shift amount of the microlens 108 has been explained above. Even when the angle of incident light is small, the focus detection performance can be improved for the same reason.

As shown in FIGS. 15A to 15C, d represents the shortest distance between the first opening 112 (116) and the second opening 111 (115) (or the boundary line 110), and w represents the width (diameter) of the condensed spot 131. At this time, it is preferable to establish w≤d≤3w. Here, λ represents the wavelength of incident light, n represents the refractive index of the insulating film 104, L represents the distance from the apex of the microlens 108 to the light blocking portion 109, and D represents the size of the focus detection pixel 100. When the color filter 107 is arranged, the wavelength λ of incident light is the maximum wavelength of the transmittance of the color filter 107. When the color filter 107 is not arranged, the wavelength λ of incident light is the center wavelength of the incident light. At this time, the width w of the condensed spot is given by w=1.22×λ×L/D/n in accordance with wave optics. For example, when D=4 μm, λ=0.45 μm, L=3 μm, and n=1.46, it is preferable that w=0.34 μm and d falls within the range of 0.34 μm≤d≤1.03 μm.

Figure 8D:
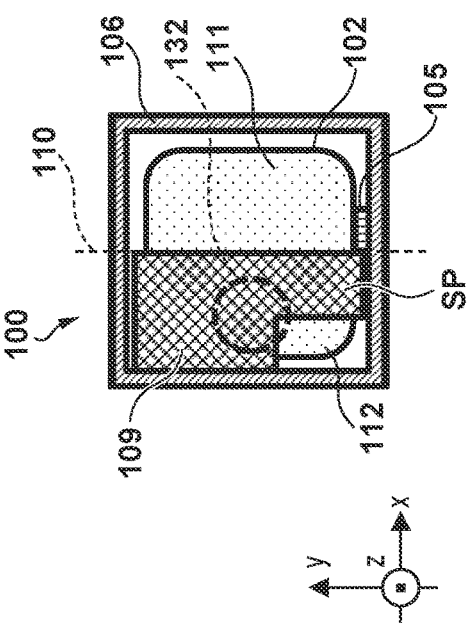

When w≤d, if the condensed spots 131 exist on the boundary lines 110, the light blocking portions 109 and 113 can block incident light, and the gradient with respect to the abscissa θx can be made steep, as in the A image 121 and the B image 122 in FIGS. 11A and 14A. Thus, the distance between the barycenters of the A and B images can be increased, and the focus detection performance can be improved. When d≤3w, if the condensed spots 131 shift from the boundary lines 110, as shown in FIGS. 8C and 8D, incident light can enter the photoelectric converters 102 through the openings 112 and 116. As shown in FIG. 15B, the condensed spot 131 has the distance w from the maximum peak value of the field strength to a zero point, has the distance w from the zero point to the next zero point, and has a small peak value between them. By setting d≤3w, a region of the condensed spot 131 where the small peak value exists enters the photoelectric converter 102 through one of the openings 111 and 115 and the opening 112 and 116. Accordingly, a gradient with respect to the abscissa θx can be obtained, as in the A image 121 in FIGS. 11B and 14B, the distance between the barycenters of the A and B images is increased, and the focus detection performance can be improved.

The light blocking portion 109 of the focus detection pixel 100 and the light blocking portion 113 of the focus detection pixel 101 can be configured to cover part of the transfer gates 105 in the plan view (x-y face). When light impinges on the transfer gate 105, the sensitivity drops, the shape of the incident angle distribution changes, and the focus detection performance may be degraded. By blocking light with respect to part of the transfer gate 105, degradation of the focus detection performance can be suppressed.

The shapes of the light blocking portions 109 and 113 are not limited to the shapes as shown in FIGS. 2A, 2B, 3A, and 3B and may be, for example, shapes as shown in FIGS. 16A to 16H, 17A, and 17B. In particular, the light blocking portions 109 and 113 having the shapes shown in FIGS. 17A and 17B can uniformly exert an effect in all reasons R1 to R9 within the pixel region 21 shown in FIG. 18.

The second embodiment of the present invention will be described with reference to FIGS. 16A to 16H and 18. In the second embodiment, the shapes of light blocking portions 109 and 113 are adjusted in accordance with positions in a pixel region 21. For example, focus detection pixels 100 and 101 shown in FIGS. 16A and 16B are arranged in regions R1, R4, and R7. The focus detection pixels 100 and 101 shown in FIGS. 16E and 16F are arranged in regions R2, R5, and R8. The focus detection pixels 100 and 101 shown in FIGS. 16G and 16H are arranged in regions R3, R6, and R9. For example, a condensed spot is shifted to an obliquely upper left portion of the focus detection pixel on the paper surface, and it is preferable to arrange first openings 112 and 116 at upper portions on the paper surface in the region R1. As for the remaining regions, the first openings 112 and 116 are adjusted based on the same concept.

According to the second embodiment, the focus detection accuracy can be improved in all the regions R1 to R9 within the pixel region 21.

Figure 19A:
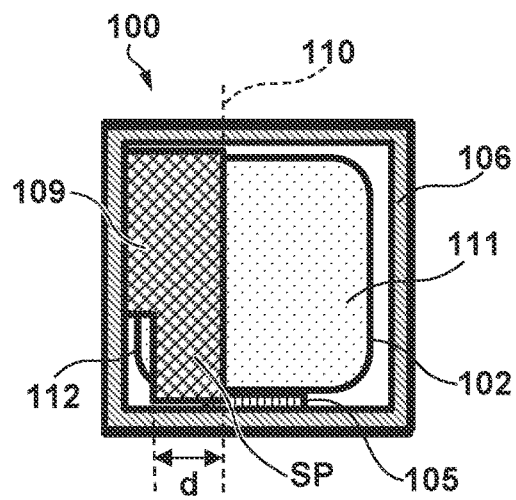
FIGS. 19A and 19B are views showing the arrangements of focus detection pixels in the solid-state image sensor according to an embodiment of the present invention.
Figure 19B:
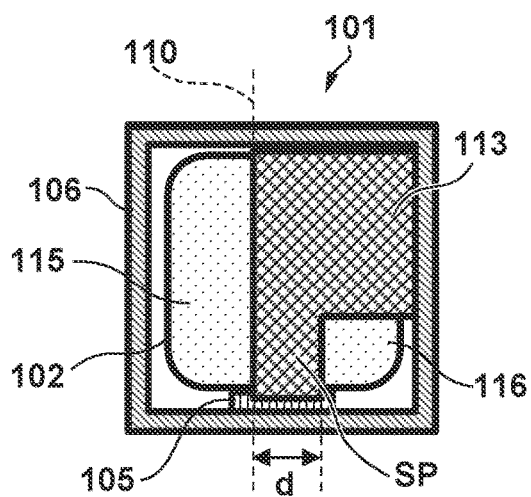

The third embodiment of the present invention will be described with reference to FIGS. 19A and 19B. In the third embodiment, a boundary line 110 shifts from the center of a photoelectric converter 102. Microlenses 108 can be shifted from the centers of focus detection pixels 100 and 101 toward the center side of the pixel region 21 and arranged in correspondence with light obliquely entering the focus detection pixels 100 and 101. Along with this, even the boundary lines 110 between light blocking portions 109 and 113 and second openings 111 and 115 can be shifted from the centers of the focus detection pixels 100 and 101 and arranged.

Further, two or more types of focus detection pixels having different light blocking portions may be arranged to coexist in each region. For example, focus detection pixels shown in FIGS. 8A to 8D and focus detection pixels shown in FIGS. 19A and 19B are arranged to coexist in a region R3. Accordingly, a more variety of imaging optical systems can be coped with in regard to the pupil distance.

The fourth embodiment of the present invention will be described. In the fourth embodiment, the areas of first openings 112 and 116 are adjusted in accordance with the image height position in each of regions R1 to R9. A greater variety of imaging optical systems can therefore be coped with in regard to the pupil distance.

The fifth embodiment of the present invention will be described with reference to FIGS. 20A and 20B. In the fifth embodiment, light blocking portions 109 and 113 are arranged at positions close to photoelectric converters 102. The characteristics of focus detection pixels 100 and 101 can be made closer to the characteristics of imaging pixels having neither the light blocking portion 109 nor 113. Further, variations between solid-state image sensors 10 in regard to incident angle distribution characteristics as shown in FIGS. 10A and 10B can be suppressed. This is because variations between the solid-state image sensors 10 owing to the influence of diffraction generated by the light blocking portion depend on variations in the distance between the light blocking portion and the photoelectric converter, and as this distance becomes shorter, variations in the distance also become smaller.

A camera 1 according to the sixth embodiment of the present invention will be described with reference to FIG. 21. The concept of the camera includes not only apparatuses mainly aiming at shooting but also apparatuses (for example, a personal computer and portable terminal) having an auxiliary shooting function. In the example shown in FIG. 21, the camera 1 is constituted as a digital still camera and/or video camera. The camera 1 includes an imaging optical system 11 that forms an object image on the imaging surface of a solid-state image sensor 10. The imaging optical system 11 may be detachable from the body of the camera 1 or fixed to the body of the camera 1. A lens controller 12 can control the focus position of the imaging optical system 11. The imaging optical system 11 includes an aperture 13 that is controlled by an aperture controller 14. By changing the aperture diameter of the aperture 13, the intensity of light entering the solid-state image sensor 10 can be adjusted.

The imaging surface of the solid-state image sensor 10 that converts an object image formed by the imaging optical system 11 into an electrical image signal by photoelectric conversion is arranged in the image space of the imaging optical system 11. The solid-state image sensor 10 can be constituted by, for example, a CMOS image sensor or a CCD image sensor.

A CPU (controller) 15 controls various operations of the camera 1. The CPU 15 includes an arithmetic unit, ROM, RAM, A/D converter, D/A converter, communication interface circuit, and the like. The CPU 15 controls the operation of each unit of the camera 1 in accordance with a computer program stored in the ROM (not shown), and controls execution of a series of shooting operations such as AF, imaging, image processing, and recording including detection (focus detection) of the focus state of the imaging optical system 11.

An image sensor controller 16 controls the operation of the solid-state image sensor 10, A/D-converts a pixel signal (imaging signal) output from the solid-state image sensor 10, and transmits the converted signal to the CPU 15. The solid-state image sensor 10 may or may not have the A/D conversion function. An image processor (processor) 17 performs image processes such as γ conversion and color interpolation on the A/D-converted imaging signal, generating an image signal. A display 18 is constituted by, for example, a liquid crystal display (LCD), and displays information about the shooting mode of the camera 1, a preview image before shooting, a confirmation image after shooting, an in-focus state at the time of focus detection, and the like. An operation switch 19 is a switch that is operated by the user. A storage medium 20 is a removable recording medium, and records shot images.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-012532, filed Jan. 26, 2015, which is hereby incorporated by reference herein in its entirety.

What is claimed is:

1. A solid-state image sensor comprising a plurality of pixels for focus detection, each of the pixels plurality of pixels including a photoelectric converter arranged in a semiconductor substrate, a microlens, and a light blocking portion arranged between the semiconductor substrate and the microlens to cover part of the photoelectric converter,
wherein a face in each of the plurality of pixels, which is parallel to a surface of the semiconductor substrate and on which the light blocking portion is arranged, includes a first opening and a second opening in addition to the light blocking portion, wherein the light blocking portion includes a separator that has a light blocking property and is arranged between the first opening and the second opening, and wherein the second opening is larger in area than the light blocking portion, and the light blocking portion is larger in area than the first opening.

2. The sensor according to claim 1, wherein when d is a shortest distance between the first opening and the second opening, and w is a width of a condensed spot formed on the face through the microlens, w≤d≤3w is satisfied.

3. The sensor according to claim 1, further comprising:
an insulating film arranged between the microlens and the semiconductor substrate; and
a color filter arranged between the insulating film and the microlens,
wherein the light blocking portion is arranged in the insulating film.

4. The sensor according to claim 3, further comprising a wiring layer between the face and the microlens in the insulating film.

5. The sensor according to claim 1, wherein each of the plurality of pixels further includes a transfer gate that forms a channel for transferring charges generated in the photoelectric converter, and
the separator is arranged to cover part of the transfer gate.

6. The sensor according to claim 5, wherein a boundary line between the second opening and the light blocking portion is perpendicular to a direction of length of the channel.

7. The sensor according to claim 1, wherein the plurality of pixels include pixels for which the respective light blocking portions are of different shapes in accordance with positions at which the pixels are arranged.

8. The sensor according to claim 1, wherein a contact plug is arranged in the first opening.

9. A camera comprising:
a solid-state image sensor including a plurality of pixels for focus detection; and
a processor configured to process a signal output from the solid-state image sensor,
wherein each of the plurality of pixels includes a photoelectric converter arranged in a semiconductor substrate, a microlens, and a light blocking portion arranged between the semiconductor substrate and the microlens to cover part of the photoelectric converter,
wherein a face in each of the plurality of pixels, which is parallel to a surface of the semiconductor substrate and on which the light blocking portion is arranged, includes a first opening and a second opening in addition to the light blocking portion, wherein the light blocking portion includes a separator that has a light blocking property and is arranged between the first opening and the second opening, and wherein the second opening is larger in area than the light blocking portion, and the light blocking portion is larger in area than the first opening.

10. A solid-state image sensor comprising a plurality of pixels for focus detection, each of the pixels including a photoelectric converter arranged in a semiconductor substrate, a microlens, a light blocking portion arranged between the semiconductor substrate and the microlens, and a transfer transistor configured to transfer charges generated in the photoelectric converter,
wherein the photoelectric converter includes a first region overlapping with the light blocking portion, a second region not overlapping with the light blocking portion, and a third region not overlapping with the light blocking portion,
wherein the second region and the third region are separated from each other by the first region,
wherein the third region is larger in area than the second region, and
wherein the light blocking portion overlaps with a gate of the transfer transistor.

11. The sensor according to claim 10, wherein an area of the first region is smaller than a sum of an area of the second region and an area of the third region.

12. The sensor according to claim 10, wherein the first region is smaller in area than the third region.

13. The sensor according to claim 10, further comprising:
an insulating film arranged between the microlens and the semiconductor substrate; and
a color filter arranged between the insulating film and the microlens,
wherein the light blocking portion is arranged in the insulating film.

14. The sensor according to claim 13, further comprising a wiring layer between the light blocking portion and the microlens in the insulating film.

15. The sensor according to claim 10, wherein an extended line from a boundary line between the third region and the first region is perpendicular to a longitudinal direction of the gate.

16. The sensor according to claim 10, wherein the plurality of pixels include pixels including the light blocking portions having different shapes in accordance with positions at which the pixels are arranged.

* * * * *